United States Patent
Hashimoto et al.

(10) Patent No.: US 11,005,475 B1
(45) Date of Patent: May 11, 2021

(54) EMISSION DRIVER AND PUMP UNIT

(71) Applicant: InnoLux Corporation, Miao-Li County (TW)

(72) Inventors: Kazuyuki Hashimoto, Miao-Li County (TW); Hirofumi Watsuda, Miao-Li County (TW); Hidetoshi Watanabe, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/734,496

(22) Filed: Jan. 6, 2020

(51) Int. Cl.
*H03K 19/01* (2006.01)
*H03K 17/76* (2006.01)
*H03K 19/094* (2006.01)
*H03K 19/0185* (2006.01)

(52) U.S. Cl.
CPC .......... *H03K 17/76* (2013.01); *H03K 19/094* (2013.01); *H03K 19/0185* (2013.01)

(58) Field of Classification Search
CPC ... H03K 19/0185; H03K 19/094; H03K 19/76
See application file for complete search history.

(56) References Cited

U.S. PATENT DOCUMENTS

| 5,161,120 A * | 11/1992 | Kajimoto | G11C 11/406 365/189.05 |
| 7,793,177 B2 * | 9/2010 | Chen | G01R 31/318572 714/724 |
| 2006/0248421 A1 * | 11/2006 | Choi | G09G 3/3266 714/731 |
| 2007/0079192 A1 * | 4/2007 | Kim | G09G 3/3266 714/726 |
| 2011/0234652 A1 * | 9/2011 | Lee | H02M 3/073 345/690 |
| 2011/0238203 A1 * | 9/2011 | Hao | H02M 3/073 700/121 |
| 2016/0379558 A1 * | 12/2016 | Jeon | G11C 19/184 345/213 |

* cited by examiner

*Primary Examiner* — Kurtis R Bahr
(74) *Attorney, Agent, or Firm* — McClure, Qualey & Rodack, LLP

(57) ABSTRACT

An emission driver includes a latch circuit and a buffer circuit. The latch circuit receives a first signal, a second signal, and a first clock signal. The latch circuit includes a first output terminal and a second output terminal. The first output terminal of the latch circuit outputs a third signal according to the first clock signal. The second output terminal of the latch circuit outputs a fourth signal in reverse to the third signal according to the first clock signal. The buffer circuit includes a first input terminal, a second input terminal and a third output terminal. The first input terminal of the buffer circuit receives the third signal. The second input terminal of the buffer circuit receives the fourth signal. The third output terminal of the buffer circuit outputs an emission signal according to the third signal and the fourth signal.

19 Claims, 19 Drawing Sheets

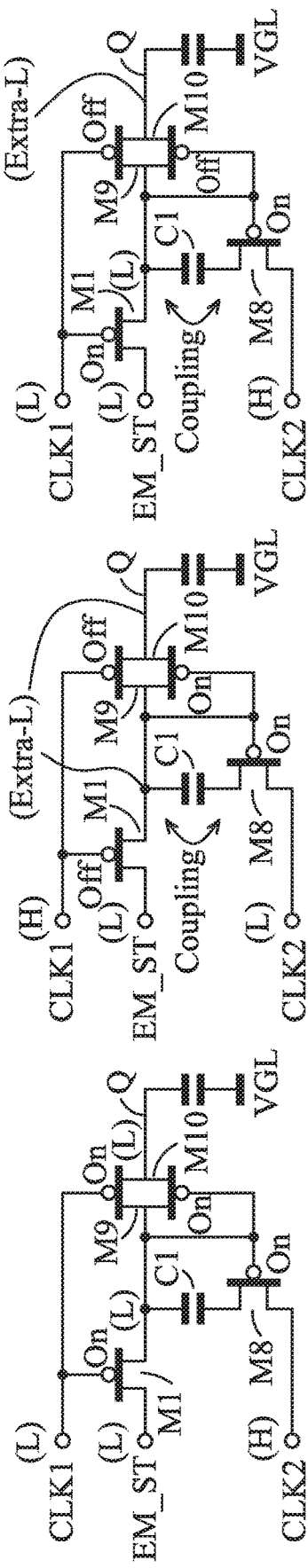
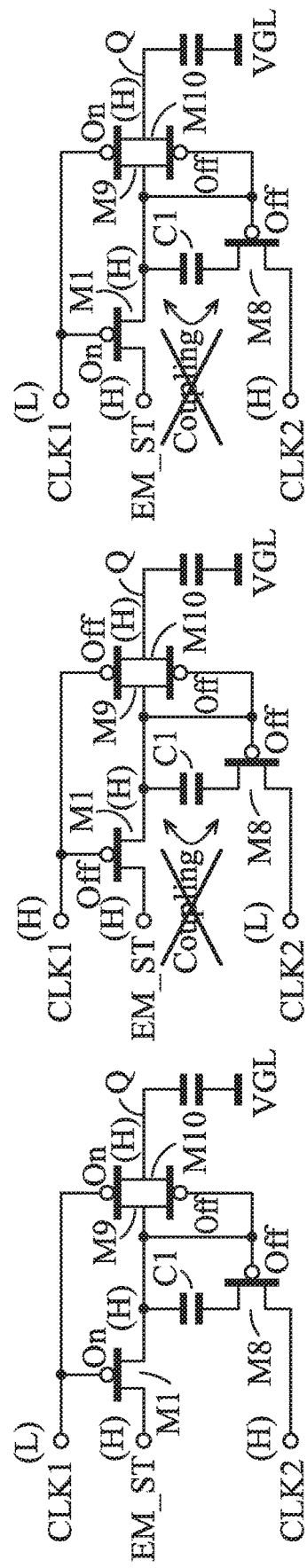
FIG. 13A FIG. 13B FIG. 13C
FIG. 13D FIG. 13E FIG. 13F

EMISSION DRIVER AND PUMP UNIT

BACKGROUND OF THE DISCLOSURE

Field of the Disclosure

An embodiment of the disclosure relates to an emission driver and a pump unit.

Description of the Related Art

Electronic devices have become indispensable necessities to modern people no matter in their work, study or entertainment. With a flourishing development of the portable electronic devices, the consumers not only pursue better electronic characteristics such as higher display quality, higher speed of response, longer life span or higher reliability, but also have higher expects on the functions or the stability of the products to be more diversified.

BRIEF SUMMARY OF THE DISCLOSURE

An embodiment of the disclosure provides an emission driver and a pump unit, thereby effectively improving the stability of the emission signal or the operational stability of the emission driver.

An embodiment of the disclosure provides an emission driver, which includes a latch circuit and a buffer circuit. The latch circuit receives a first signal, a second signal, and a first clock signal. The latch circuit includes a first output terminal and a second output terminal. The first output terminal of the latch circuit outputs a third signal according to the first clock signal. The second output terminal of the latch circuit outputs a fourth signal in reverse to the third signal according to the first clock signal. The buffer circuit includes a first input terminal, a second input terminal and a third output terminal. The first input terminal of the buffer circuit receives the third signal. The second input terminal of the buffer circuit receives the fourth signal. The third output terminal of the buffer circuit outputs an emission signal according to the third signal and the fourth signal.

In addition, an embodiment of the disclosure provides a pump unit, which includes a capacitor, a first transistor, a second transistor and a third transistor. The capacitor has a first terminal for receiving a first signal and a second terminal. The first transistor has a first terminal coupled to the second terminal of the capacitor, a second terminal for receiving a second signal, and a first gate terminal coupled to the first terminal of the capacitor. The second transistor has a third terminal coupled to the first terminal of the capacitor, a fourth terminal for outputting an output signal, and a second gate terminal for receiving a third signal. The third transistor has a fifth terminal coupled to the first terminal of the second transistor, a sixth terminal coupled to the fourth terminal of the second transistor, and a third gate terminal coupled to the fifth terminal of the third transistor.

BRIEF DESCRIPTION OF THE DRAWINGS

The disclosure can be fully understood by reading the subsequent detailed description and examples with references made to the accompanying drawings, wherein:

FIG. 13A-13C are schematic views of the operation of the pump unit according to an embodiment of the disclosure;

FIG. 13D-13F are another schematic views of the operation of the pump unit according to an embodiment of the disclosure;

DETAILED DESCRIPTION OF THE DISCLOSURE

Figure 2:
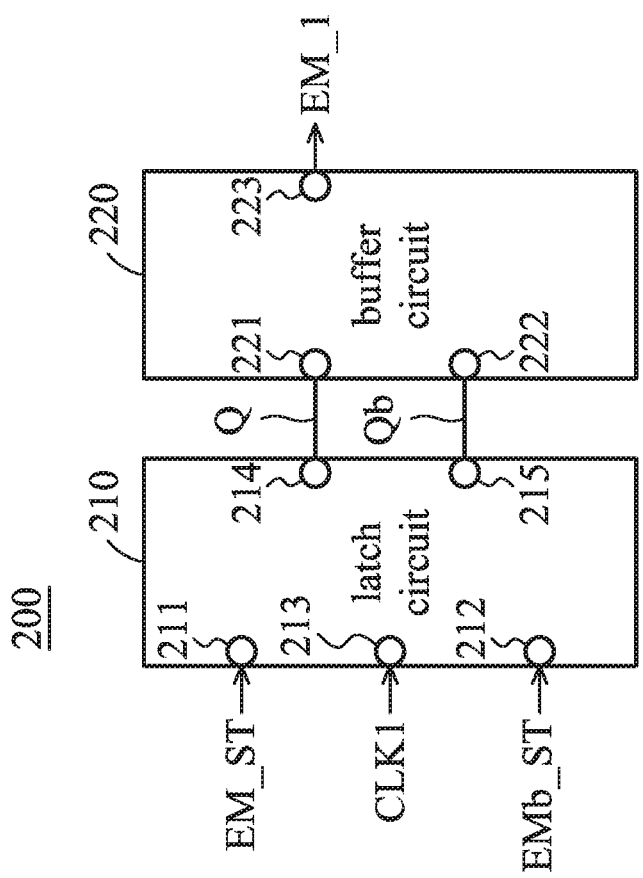
FIG. 2 is a schematic view of an emission driver according to an embodiment of the disclosure.

In order to make objects, features and advantages of the disclosure more obvious and easily understood, the embodiments are described below, and the detailed description is made in conjunction with the drawings. In order to help the reader to understand the drawings, the multiple drawings in the disclosure may merely depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes only, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as "first", "second", etc., in the specification and the claims to describe a claim element does not by itself connote and represent the claim element having any previous ordinal term, and does not represent the order of one claim element over another or the order of the manufacturing method, either. The ordinal terms are used merely as labels to distinguish one claim element having a certain name from another element having the same name.

In the disclosure, the technical features of the various embodiments may be replaced or combined with each other to complete other embodiments without being mutually exclusive.

Figure 1:
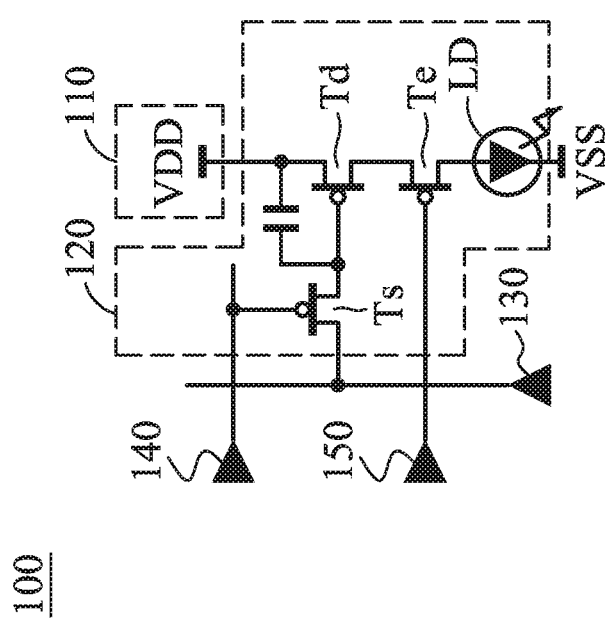
FIG. 1 is a schematic view of an electronic device according to an embodiment of the disclosure.

FIG. 1 is a schematic view of an electronic device according to an embodiment of the disclosure. Please refer to FIG. 1. The electronic device 100 may include a power source unit 110 and an electronic unit 120. The power source unit 110 provides a power source VDD, wherein the voltage of the power source VDD may be, for example, a system voltage. In an embodiment, the electronic device 100 may include an organic light-emitting diode (OLED), a light-emitting diode (LED), quantum dot (QD), a fluorescent material, a phosphorescent material, other suitable materials, or a combination thereof, but the disclosure is not limited thereto. The light-emitting diode may include, for example, a mini light-emitting diode (mini LED), a micro light-emitting diode (micro LED) or a quantum dot light-emitting diode (QLED/QDLED). In some embodiments, the electronic device 100 may be a display device, a sensing device, a lighting device, an antenna device, a tiled device, a flexible device, another suitable device, or a combination thereof, but the disclosure is not limited thereto. When the electronic device 100 is a display device, the electronic unit 120 may be a pixel, but the disclosure is not limited thereto.

In FIG. 1, there is one electronic unit 120, but the disclosure is not limited thereto. In some embodiments, the electronic device 100 may include a plurality of electronic units 120 arranged in one or more columns and/or one or more rows (for example, a matrix), a plurality of data lines (not shown), and a plurality of scan lines (not shown). One electronic unit 120 may include a switch Td, a switch Ts, a switch Te, a data line controlled by a data driver 130, a scan line, an emission line and a light-emitting unit LD. The scan line may be controlled by a scan driver 140. The emission (EM) line may be controlled by an emission (EM) driver 150. The switch Td may be coupled to the power source unit 110. In some embodiments, the switch Td may be a thin film transistor (TFT), but the disclosure is not limited thereto.

The switch Te may be coupled to the switch Td. In some embodiments, the switch Te may be a thin film transistor, but the disclosure is not limited thereto. In addition, a gate terminal of the switch Te may be coupled to the EM driver 150.

The light-emitting unit LD may be coupled to the switch Te. Furthermore, a first terminal (such as an anode terminal) of the light-emitting unit LD may be coupled to a first terminal of the switch Te, and a second terminal (such as a cathode terminal) of the light-emitting unit LD may be coupled to a reference voltage VSS (such as a ground voltage). In some embodiments, the light-emitting unit LD may be an OLED or a LED (such as a mini LED, a micro LED, or a QLED/QD-LED), but the disclosure is not limited thereto.

The switch Ts may be coupled to the switch Td, the data driver 130 and the scan driver 140. In some embodiments, the switch Ts may be a thin film transistor, but the disclosure is not limited thereto. Furthermore, a first terminal of the switch Ts may be coupled to the data driver 130 through a corresponding data line, a second terminal of the switch Ts may be coupled to a gate terminal of the switch Td, and a gate terminal of the switch Ts may be coupled to the scan driver 140 through a corresponding scan line.

FIG. 2 is a schematic view of an emission driver according to an embodiment of the disclosure. In the embedment, The EM driver 200 may be, for example, the EM driver 150 in FIG. 1. Please refer to FIG. 2. The EM driver 200 may include a latch circuit 210 and a buffer circuit 220.

The latch circuit 210 may include an input terminal 211, an input terminal 212 and an input terminal 213, an output terminal 214 and an output terminal 215. The input terminal 211 of the latch circuit 210 may receive a signal EM_ST. The input terminal 212 of the latch circuit 210 may receive a signal EMb_ST. The input terminal 213 of the latch circuit 210 may receive a clock signal CLK1.

The output terminal 214 of the latch circuit 210 may output a signal Q according to the clock signal CLK1. For example, when the clock signal CLK1 is at a low logic level "L", the output terminal 214 of the latch circuit 210 outputs the signal Q the same as the signal EM_ST. When the clock signal CLK1 is at a high logic level "H", the output terminal 214 of the latch circuit 210 maintains the logic level of the signal Q.

The output terminal 215 of the latch circuit 210 may output a signal Qb in reverse to the signal Q according to the clock signal CLK1. For example, when the clock signal CLK1 is at the low logic level "L", the output terminal 215 of the latch circuit 210 outputs the signal Qb the same as the signal EMb_ST. When the clock signal CLK1 is at the high logic level "H", the output terminal 215 of the latch circuit 210 maintains the logic level of the signal Qb. In the embodiment, when the clock signal CLK1 is at the low logic level "L", it indicates that the EM driver 200 operates in a latch mode. At this time, the signal EMb_ST is a complementary signal in reverse to the signal EM_ST.

The buffer circuit 220 may include an input terminal 221, an input terminal 222 and an output terminal 223. The input terminal 221 of the buffer circuit 220 may be coupled to the output terminal 214 of the latch circuit 210 and receive the signal Q. The input terminal 222 of the buffer circuit 220 may be coupled to the output terminal 215 of the latch circuit 210 and receive the signal Qb. The output terminal 223 of the buffer circuit 220 may output an emission (EM) signal EM_1 according to the signal Q and the signal Qb. For example, when the signal Q is at the high logic level "H" and the signal Qb is at the low logic level "L", the EM signal EM_1 is at the high logic level "H". When the signal Q is at the low logic level "L" and the signal Qb is at the high logic level "H", the EM signal EM_1 is at the low logic level "L".

Figure 3:
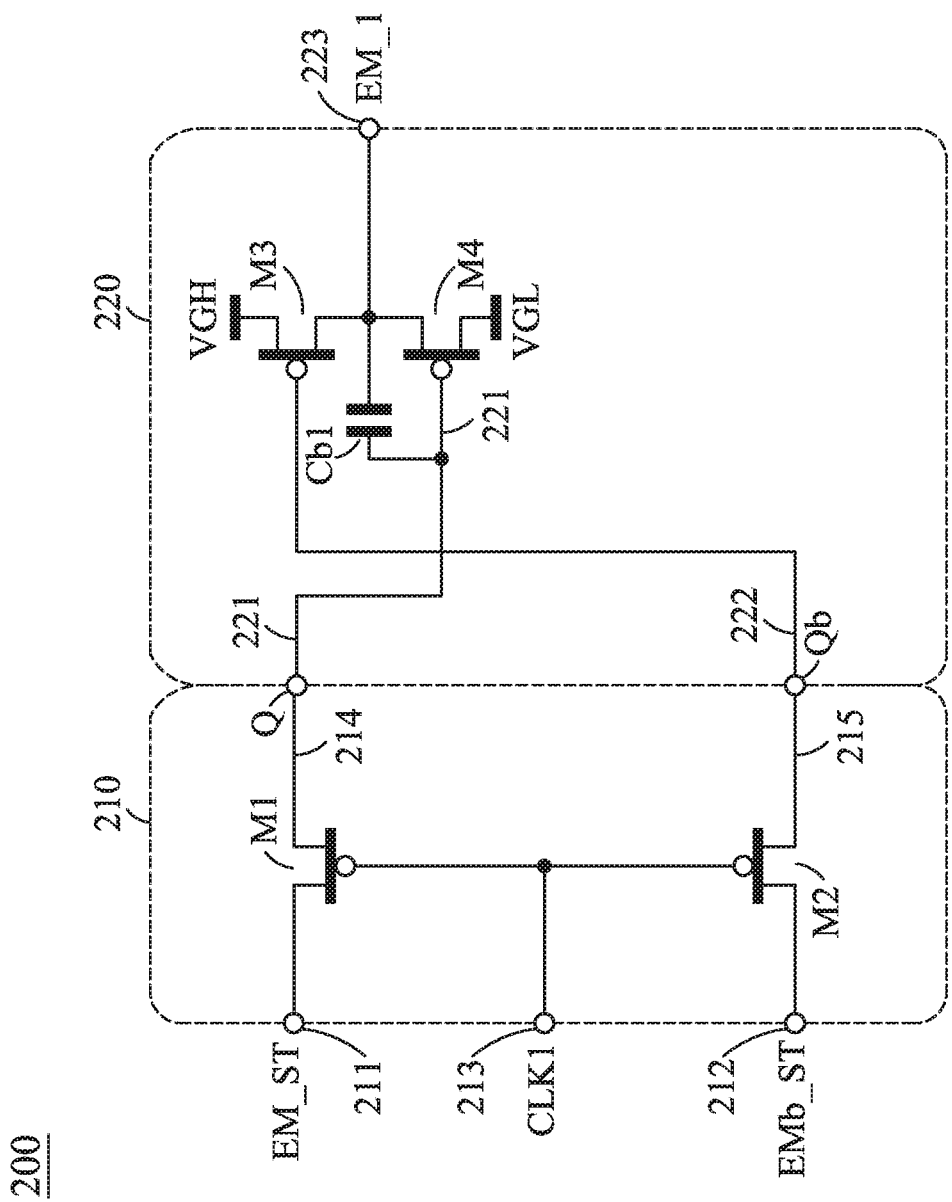
FIG. 3 a circuit diagram of the emission driver in FIG. 2.

FIG. 3 a circuit diagram of the emission driver in FIG. 2. Please refer to FIG. 3. The latch circuit 210 may include a transistor M1 and a transistor M2. The transistor M1 has a first terminal, a second terminal and a gate terminal. The first terminal of the transistor M1 may be coupled to the input terminal 211 of the latch circuit 210 and receive the signal EM_ST. The second terminal of the transistor M1 may be coupled to the output terminal 214 of the latch circuit 210. The gate terminal of the transistor M1 may be coupled to the input terminal 213 of the latch circuit 210 and receive the clock signal CLK1.

The transistor M2 has a first terminal, a second terminal and a gate terminal. The first terminal of the transistor M2 may be coupled to the input terminal 212 of the latch circuit 210 and receive the signal EMb_ST. The second terminal of the transistor M2 may be coupled to the output terminal 215 of the latch circuit 210. The gate terminal of the transistor M2 may be coupled to the input terminal 213 of the latch circuit 210 and receive the clock signal CLK1.

The buffer circuit 220 may include a transistor M3 and a transistor M4. The transistor M3 has a first terminal, a second terminal and a gate terminal. The first terminal of the transistor M3 may receive a voltage VGH. The second terminal of the transistor M3 may be coupled to the output terminal 223 of the buffer circuit 220. The gate terminal of the transistor M3 may be coupled to the input terminal 222 of the buffer circuit 220, i.e., the gate terminal of the transistor M3 is coupled to the output terminal 215 of the latch circuit 210.

The transistor M4 has a first terminal, a second terminal and a gate terminal. The first terminal of the transistor M4 may be coupled to the output terminal 223 of the buffer circuit 220. The second terminal of the transistor M4 may receive a voltage VGL. The gate terminal of the transistor M4 may be coupled to the input terminal 221 of the buffer circuit 220, i.e., the gate terminal of the transistor M4 is coupled to the output terminal 214 of the latch circuit 210. In the embodiment, the voltage VGL is lower than the voltage VGH. For example, the voltage VGH may be the system voltage, and the voltage VGL may be a ground voltage. In the embodiment, the buffer circuit 220 may further include a capacitor Cb1. The capacitor Cb1 may be coupled between the first terminal and the gate terminal of the transistor M4.

Figure 4:
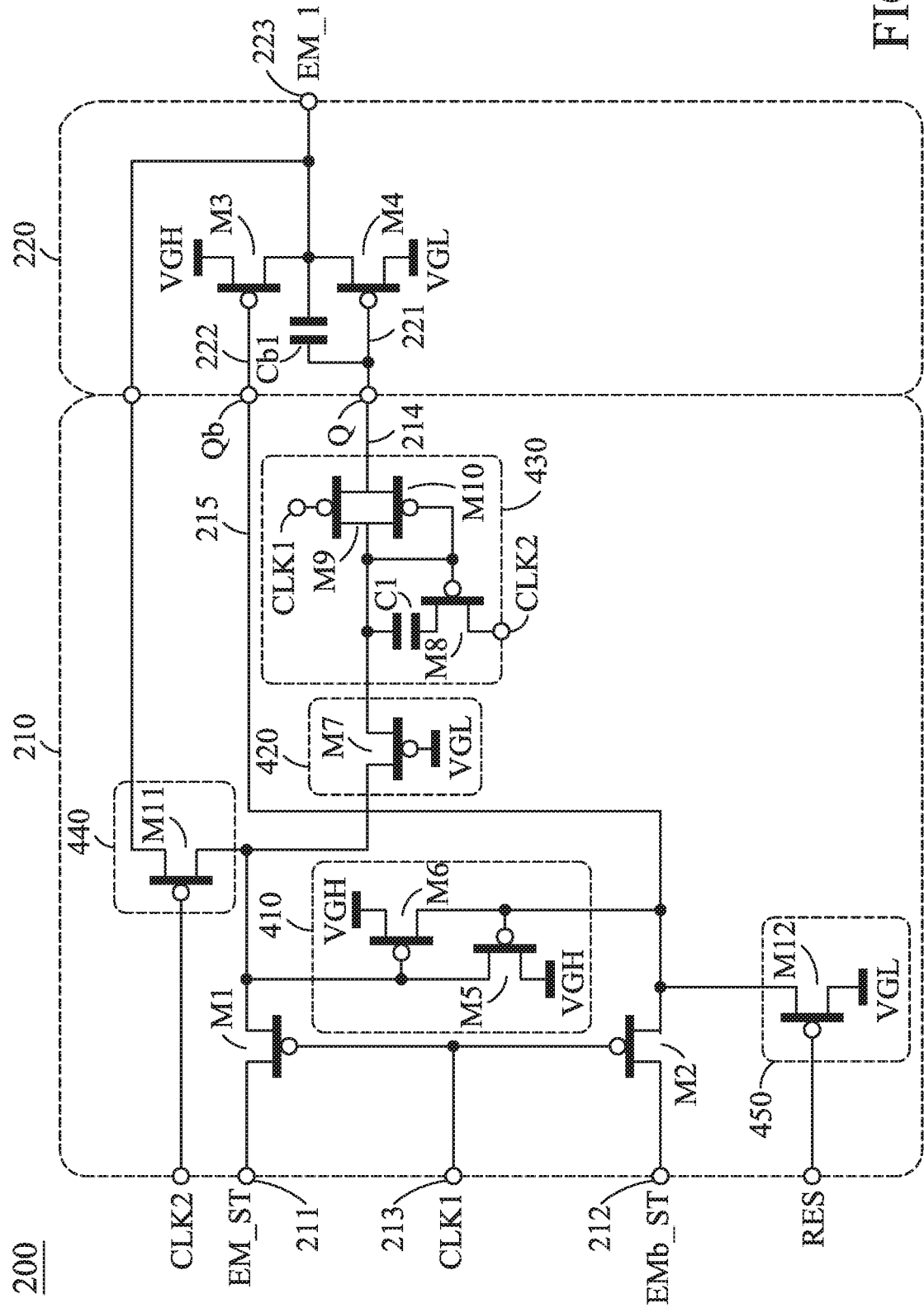
FIG. 4 is another exemplary circuit diagram of the emission driver in FIG. 2.

FIG. 4 is another exemplary circuit diagram of the emission driver in FIG. 2. Please refer to FIG. 4. The latch circuit 210 may include a transistor M1, a transistor M2, a pull-up unit 410, a switch 420, a pump unit 430, a feedback switch 440 and a reset switch 450. In addition, the buffer circuit 220 includes a transistor M3 and a transistor M4. In the embodiment, the transistor M1, the transistor M2, the transistor M3 and the transistor M4 in FIG. 4 are the same as or similar to the transistor M1, the transistor M2, the transistor M3 and the transistor M4 in FIG. 3. The description is provided in the embodiment of FIG. 3, and the description thereof is not repeated herein. In some embodiments, the pump unit 430 may be a pump-up unit when the pump unit 430 includes P-type switch(es), but it is not limited thereto. In other embodiments, the pump unit 430 may be a pump-down unit when the pump unit 430 includes N-type switch(es), but it is not limited thereto.

The pull-up unit 410 may be coupled between the second terminal of the transistor M1 and the second terminal of the transistor M2. The pull-up unit 410 may be operated to maintain the stability when the signal Q or the signal Qb is at the high logic level "H".

In the embodiment, the pull-up unit 410 may include a transistor M5 and a transistor M6. The transistor M5 has a first terminal, a second terminal and a gate terminal. The first terminal of the transistor M5 may receive the voltage VGH. The second terminal of the transistor M5 may be coupled to the second terminal of the transistor M1. The gate terminal of the transistor M5 may be coupled to the second terminal of the transistor M2.

The transistor M6 has a first terminal, a second terminal and a gate terminal. The first terminal of the transistor M6 may receive the voltage VGH. The second terminal of the transistor M6 may be coupled to the gate terminal of the transistor M5. The gate terminal of the transistor M6 is coupled to the second terminal of the transistor M5.

The switch 420 may be coupled between the second terminal of the transistor M1 and the pump unit 430. The switch 420 may be operated to protect the transistor (such as the transistor M1) between the input terminal 211 and the output terminal 214 of the latch circuit 210 to isolate the signal Q for effective bootstrap.

In the embodiment, the switch 420 may include a transistor M7. The transistor M7 has a first terminal, a second terminal and a gate terminal. The first terminal of the transistor M7 may be coupled to the second terminal of the transistor M1. The second terminal of the transistor M7 may be coupled to the pump unit 430. The gate terminal of the transistor M7 may receive the voltage VGL.

The pump unit 430 may be coupled between the switch 420 and the output terminal 214 of the latch circuit 210. In the embodiment, the pump unit 430 may include a capacitor C1, a transistor M8, a transistor M9 and a transistor M10. The capacitor C1 has a first terminal and a second terminal. The first terminal of the capacitor C1 may be coupled to the switch 420 (such as the second terminal of the transistor M7).

The transistor M8 has a first terminal, a second terminal and a gate terminal. The first terminal of the transistor M8 may be coupled to the second terminal of the capacitor C1. The second terminal of the transistor M8 may receive a clock signal CLK2. The gate terminal of the transistor M8 is coupled to the first terminal of the capacitor C1.

The transistor M9 has a first terminal, a second terminal and a gate terminal. The first terminal of the transistor M9 may be coupled to the first terminal of the capacitor C1. The second terminal of the transistor M9 may be coupled to the output terminal 214. The gate terminal of the transistor M9 may receive the clock signal CLK1.

The transistor M10 has a first terminal, a second terminal and a gate terminal. The first terminal of the transistor M10 may be coupled to the first terminal of the transistor M9. The second terminal of the transistor M10 may be coupled to the second terminal of the transistor M9. The gate terminal of the transistor M10 may be coupled to the first terminal of the transistor M10. The pump unit 430 may be operated to enhance an extra-low voltage for the gate terminal of the transistor M10.

The feedback switch 440 may be coupled between the second terminal of the transistor M1 and the output terminal 223 of the buffer circuit 220. The feedback switch 440 may be operated to maintain the voltage level of the signal Q as the voltage level of the EM signal EM_1 after the latch circuit 210 latches the signal.

In the embodiment, the feedback switch 440 may include a transistor M11. The transistor M11 has a first terminal, a second terminal and a gate terminal. The first terminal of the transistor M11 may be coupled to the output terminal 223 of the buffer circuit 220. The second terminal of the transistor M11 may be coupled to the second terminal of the transistor M1. The gate terminal of the transistor M11 may receive the clock signal CLK2.

The reset switch 450 may be coupled to the output terminal 215 of the latch circuit 210 and the second terminal of the transistor M2. In the embodiment, the reset switch 450 may include a transistor M12. The transistor M12 has a first terminal, a second terminal and a gate terminal. The first terminal of the transistor M12 may be coupled to the output terminal 215 and the second terminal of the transistor M2. The second terminal of the transistor M12 may receive the voltage VGL. The gate terminal of the transistor M12 may receive a reset signal RES.

In FIG. 4, the latch circuit 210 may include the pull-up unit 410, the switch 420, the pump unit 430, the feedback switch 440 and the reset switch 450, but the embodiment of the disclosure is not limited thereto. In some embodiments, the user may select at least one of the pull-up unit 410, the switch 420, the pump unit 430, the feedback switch 440 and the reset switch 450 or a combination thereof according to the requirements thereof.

For example, in some embodiments, at least one of the pull-up unit 410, the switch 420, the pump unit 430, the feedback switch 440 and the reset switch 450 may be omitted, but not limited thereto.

Figure 5C:
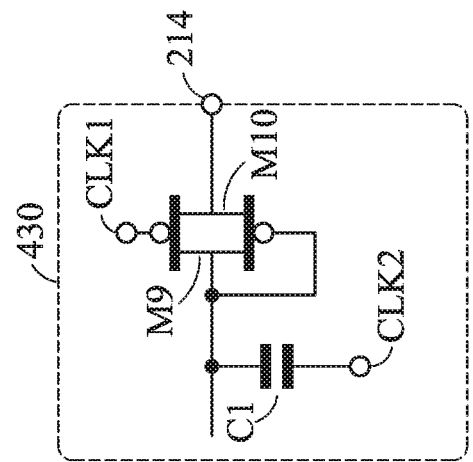
FIGS. 5A-5C are circuit diagrams of the pump unit according to an embodiment of the disclosure.

In FIG. 4, the pump unit 430 including the capacitor C1 and the transistor M8, the transistor M9 and the transistor M10 is one exemplary embodiment of the disclosure, but the embodiment of the disclosure is not limited thereto. In some embodiments, the pump unit 430 may include the capacitor C1 and the transistor M8, as shown in FIG. 5A. In FIG. 5A, the first terminal of the capacitor C1 may be coupled to the output terminal 214 of the latch circuit 210 in FIG. 4. The first terminal of the transistor M8 may be coupled to the second terminal of the capacitor C1. The second terminal of the transistor M8 may receive the clock signal CLK2. The gate terminal of the transistor M8 may be coupled to the first terminal of the capacitor C1.

Figure 5B:
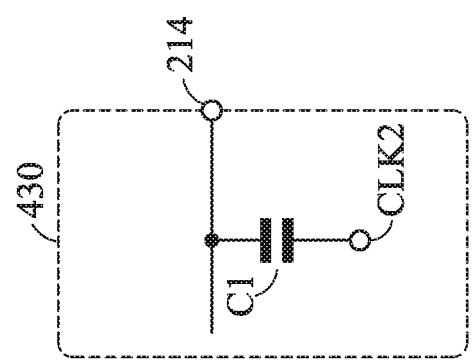
Figure 5A:
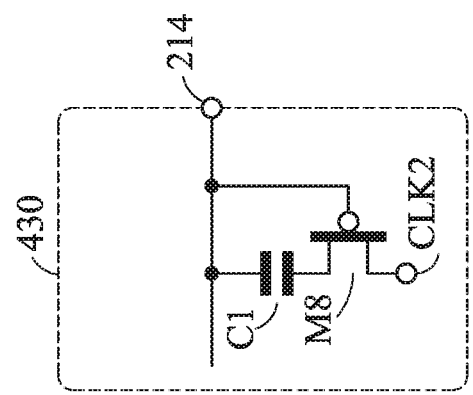

In some embodiments, the pump unit 430 may include the capacitor C1, as shown in FIG. 5B. In FIG. 5B, the first terminal of the capacitor C1 may be coupled to the output terminal 214 of the latch circuit 210 in FIG. 4, and the second terminal of the capacitor C1 may receive the clock signal CLK2.

In some embodiments, the latch circuit pump unit 430 may include the capacitor C1 and the transistor M9 and the transistor M10, as shown in FIG. 5C. In FIG. 5C, the second terminal of the capacitor C1 may receive the clock signal CLK2. The first terminal of the transistor M9 may be coupled to the first terminal of the capacitor C1. The second terminal of the transistor M9 may be coupled to the output terminal 214 of the latch circuit 210 in FIG. 4. The gate terminal of the transistor M9 may receive the clock signal CLK1. The first terminal of the transistor M10 may be coupled to the first terminal of the transistor M9. The second terminal of the transistor M10 may be coupled to the second terminal of the transistor M9. The gate terminal of the transistor M10 may be coupled to the first terminal of the transistor M10.

Figure 6:
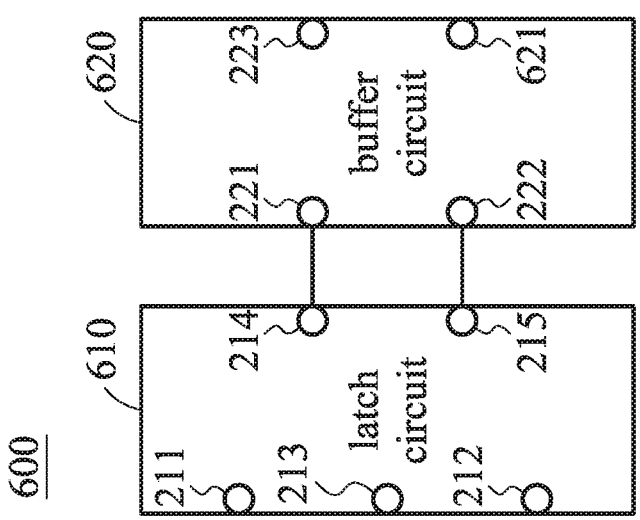
FIG. 6 is another schematic view of the emission driver according to an embodiment of the disclosure.

FIG. 6 is another schematic view of the emission driver according to an embodiment of the disclosure. In the embodiment, The EM driver 600 may also be, for example, the EM driver 150 in FIG. 1. Please refer to FIG. 6. The EM driver 600 may include a latch circuit 610 and a buffer circuit 620. The latch circuit 610 may include an input terminal 211, an input terminal 212, an input terminal 213, an output terminal 214 and an output terminal 215. In the embodiment, the latch circuit 610 in FIG. 6 is the same as or similar to the latch circuit 210 in FIG. 2. The embodiment of FIG. 2 may be referred to for a description of the latch circuit 610 in FIG. 6, and the description thereof is not repeated herein.

The buffer circuit 620 may include an input terminal 221, an input terminal 222, an output terminal 223, and an output terminal 621. The input terminal 221, the input terminal 222, and the output terminal 223 in FIG. 6 are the same as or similar to the input terminal 221, the input terminal 222 and the output terminal 223 in FIG. 2. The description of the input terminal 221, the input terminal 222 and the output terminal 223 in FIG. 6 are provided in the embodiment of FIG. 2, and the description thereof is not repeated herein.

Figure 7:
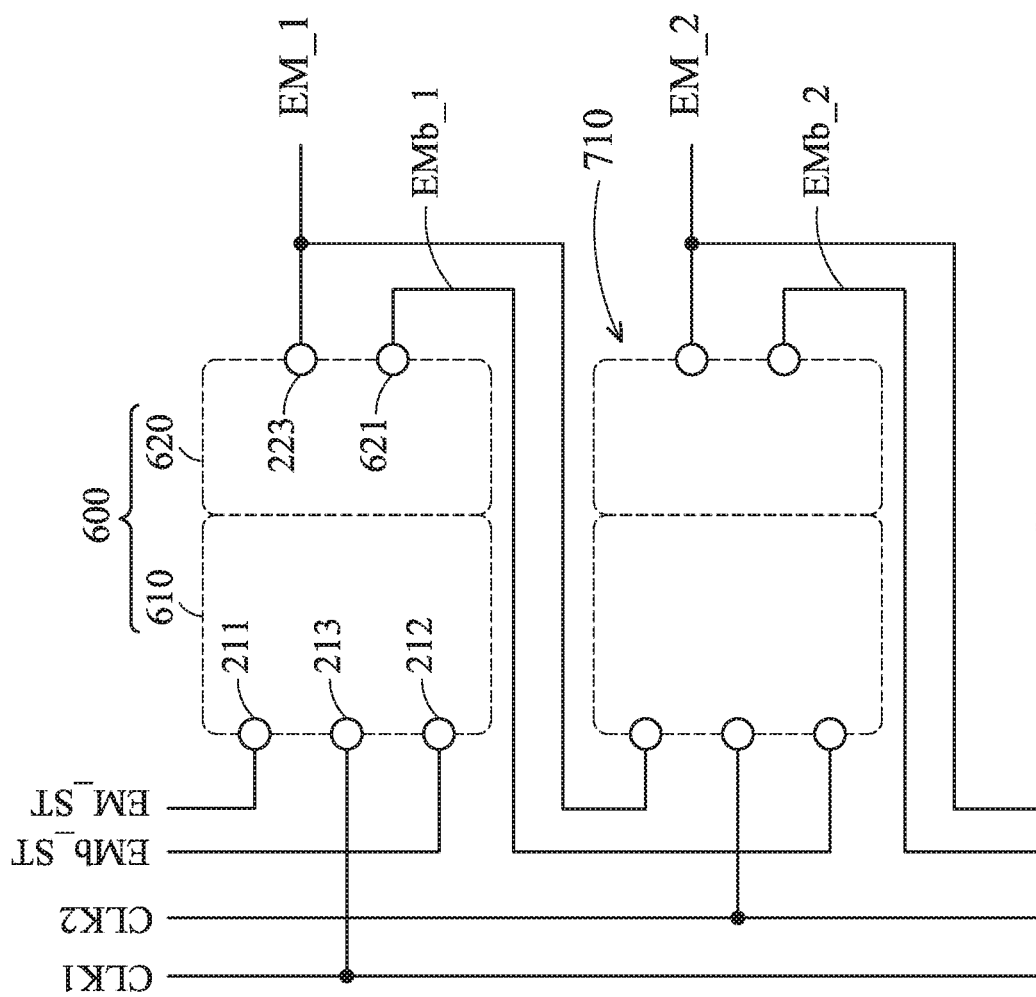
FIG. 7 is a schematic view of the coupling relationship of the emission drivers according to an embodiment of the disclosure.

The output terminal 621 of the buffer circuit 620 may output a complementary EM signal EMb_1 in reverse to the EM signal EM_1 to another EM driver 710 according to the signal Q and the signal Qb, as shown in FIG. 7. In FIG. 7 the EM driver 600 may generate the EM signal EM_1 and the complementary EM signal EMb_1 according to the signal Q and the signal Qb (shown in FIG. 2). Then, the EM signal EM_1 and the complementary EM signal EMb_1 are transmitted to the next EM driver 710, such that the EM driver 710 may generate an EM signal EM_2 and the complementary EM signal EMb 2 according to the EM signal EM_1 and the complementary EM signal EMb_1.

Figure 8:
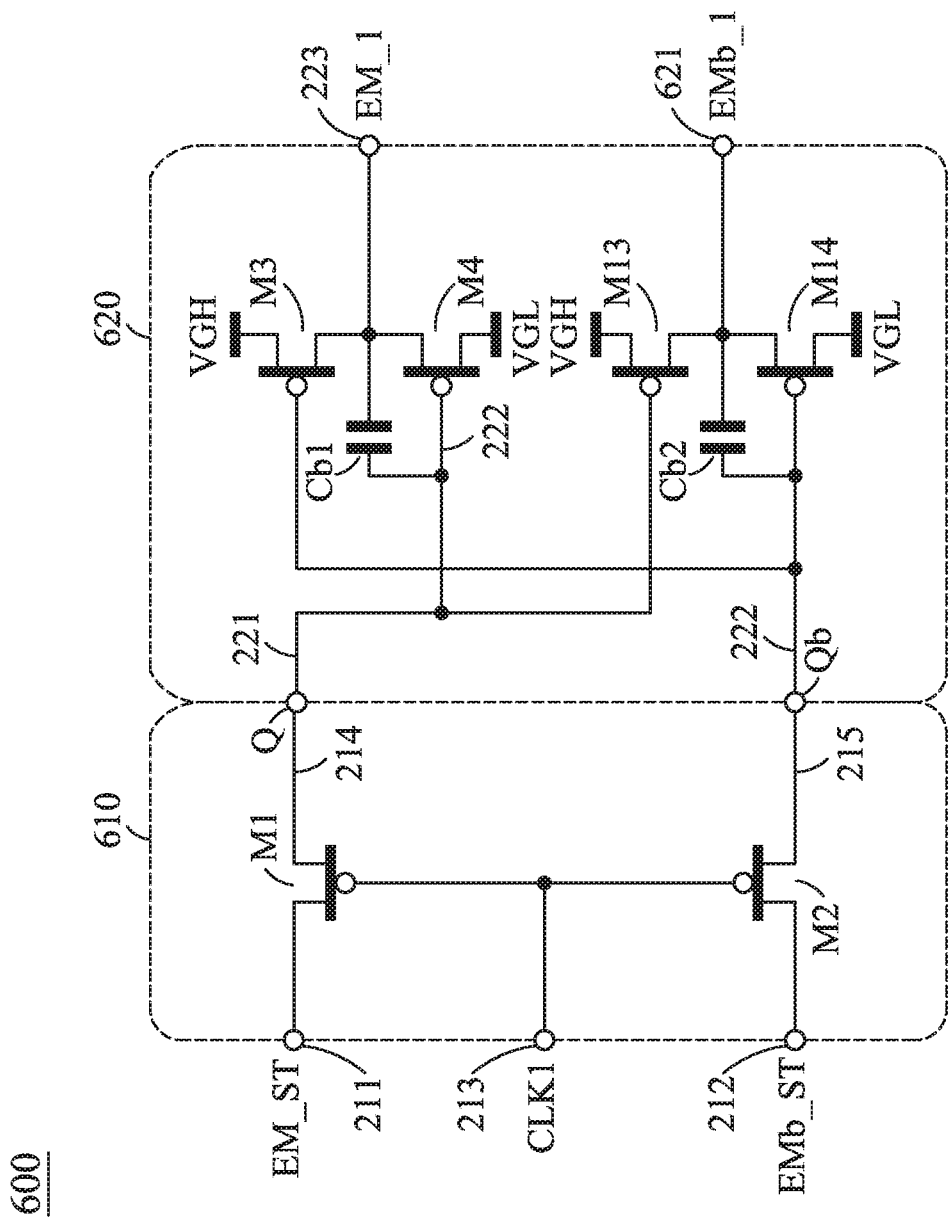
FIG. 8 is a circuit diagram of the emission driver in FIG. 6.

FIG. 8 is a circuit diagram of the emission driver in FIG. 6. Please refer to FIG. 8. The latch circuit 610 may include a transistor M1 and a transistor M2. The transistor M1 and the transistor M2 are the same as or similar to the transistor M1 and the transistor M2 in FIG. 3, and the description thereof is not repeated herein.

The buffer circuit 620 may include a transistor M3, a transistor M4, a transistor M13, a transistor M14, a capacitor Cb1 and a capacitor Cb2. The transistor M3, the transistor M4 and the capacitor Cb1 in FIG. 8 are the same as or similar to the transistor M3, the transistor M4 and the capacitor Cb in FIG. 3, and this description is not repeated herein.

The transistor M13 has a first terminal, a second terminal and a gate terminal. The first terminal of the transistor M13 may receive the voltage VGH. The second terminal of the transistor M13 may be coupled to the output terminal 621. The gate terminal of the transistor M13 may be coupled to the output terminal 214 of the latch circuit 610.

The transistor M14 has a first terminal, a second terminal and a gate terminal. The first terminal of the transistor M14 may be coupled to the output terminal 621. The second terminal of the transistor M14 may receive the voltage VGL. The gate terminal of the transistor M14 may be coupled to the output terminal 215 of the latch circuit 610. The capacitor Cb2 may be coupled between the first terminal and the gate terminal of the transistor M14.

Figure 9:
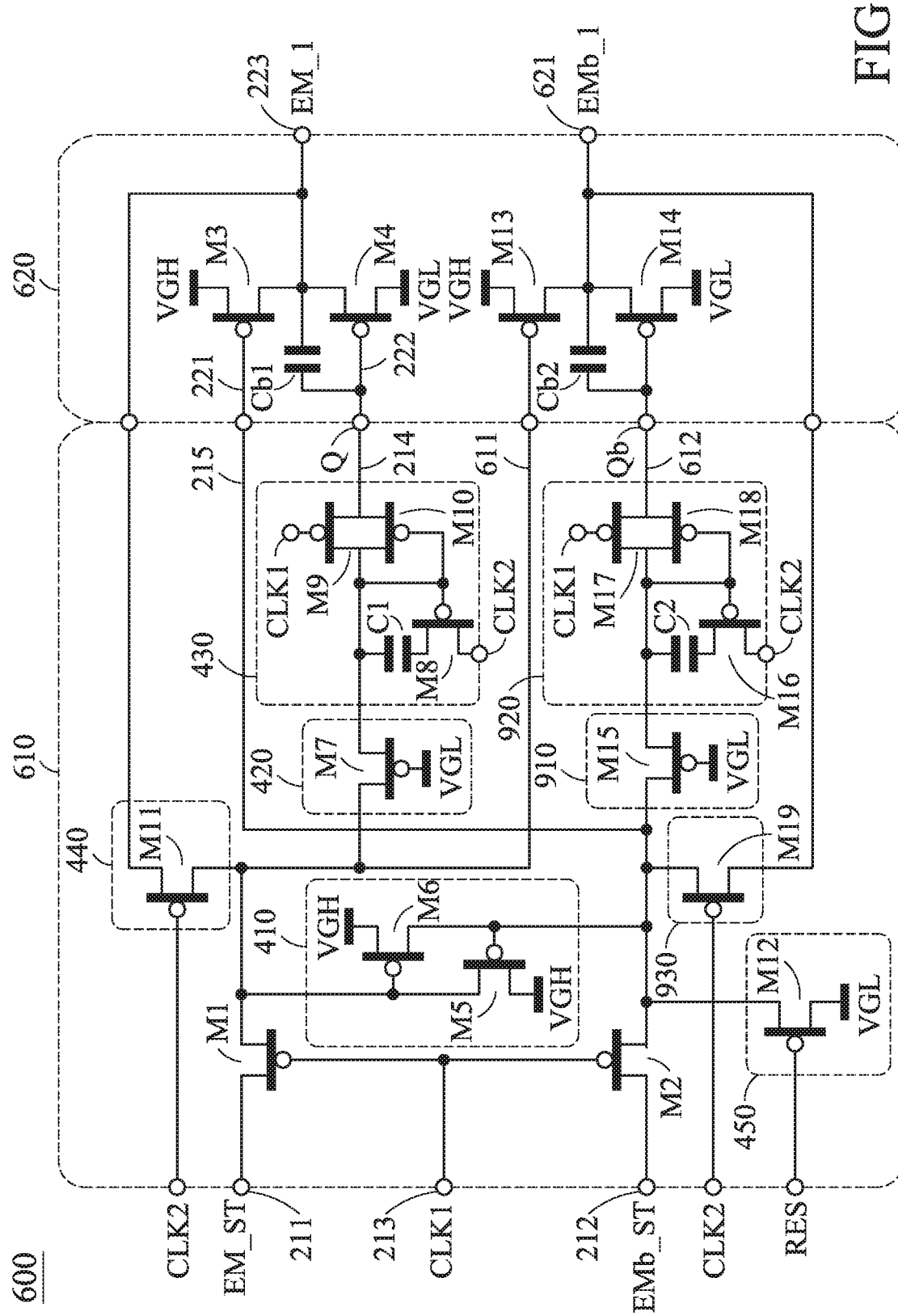
FIG. 9 is another exemplary circuit diagram of the emission driver in FIG. 6.

FIG. 9 is another exemplary circuit diagram of the emission driver in FIG. 6. Please refer to FIG. 9. The latch circuit 610 may further include an output terminal 611 and an output terminal 612. The latch circuit 610 may include a transistor M1, a transistor M2, a pull-up unit 410, a switch 420, a pump unit 430, a feedback switch 440, a reset switch 450, a switch 910, a pump unit 920 and a feedback switch 930. In the embodiment, the transistor M1, the transistor M2, the pull-up unit 410, the switch 420, the pump unit 430, the feedback switch 440 and the reset switch 450 in FIG. 9 are the same as or similar to the transistor M1, the transistor M2, the pull-up unit 410, the switch 420, the pump unit 430, the feedback switch 440 and the reset switch 450 in FIG. 4, and this description is not repeated herein. In the embodiment, the output terminal 611 of the latch circuit 610 may be further coupled to the second terminal of the transistor M1.

The switch 910 may be coupled between the second terminal of the transistor M2 and the pump circuit unit 920. The switch 910 may be operated to protect the transistor (such as the transistor M2) between the input terminal 212 and the output terminal 612 of the latch circuit 610 to isolate the signal Qb for effective bootstrap.

In the embodiment, the switch 910 may include a transistor M15. The transistor M15 has a first terminal, a second terminal and a gate terminal. The first terminal of the transistor M15 may be coupled to the second terminal of the transistor M2. The second terminal of the transistor M15 may be coupled to the pump unit 920. The gate terminal of the transistor M15 may receive the voltage VGL.

The pump unit 920 may be coupled between the switch 910 and the output terminal 612. In the embodiment, the pump unit 920 may include a capacitor C2, a transistor M16, a transistor M17 and a transistor M18. The capacitor C2 has a first terminal and a second terminal. The first terminal of the capacitor C2 may be coupled to the switch 910 (such as the second terminal of the transistor M15).

The transistor M16 has a first terminal, a second terminal and a gate terminal. The first terminal of the transistor M16 may be coupled to the second terminal of the capacitor C2. The second terminal of the transistor M16 may receive the clock signal CLK2. The gate terminal of the transistor M16 may be coupled to the first terminal of the capacitor C2.

The transistor M17 has a first terminal, a second terminal and a gate terminal. The first terminal of the transistor M17 may be coupled to the first terminal of the capacitor C2. The second terminal of the transistor M17 may be coupled to the output terminal 612. The gate terminal of the transistor M17 may receive the clock signal CLK1.

The transistor M18 has a first terminal, a second terminal and a gate terminal. The first terminal of the transistor M18 may be coupled to the first terminal of the transistor M17. The second terminal of the transistor M18 may be coupled to the second terminal of the transistor M17. The gate terminal of the transistor M18 may be coupled to the first terminal of the transistor M17. The pump unit 920 may be operated to enhance the extra-low voltage for the gate terminal of the transistor M18.

The feedback switch 930 may be coupled between the second terminal of the transistor M2 and the output terminal 621 of the buffer circuit 620. The feedback switch 930 may be operated to maintain the voltage level of the signal Qb as the voltage level of the complementary EM signal EMb_1 after the latch circuit 610 latches the signal.

In the embodiment, the feedback switch 930 may include a transistor M19. The transistor M19 has a first terminal, a second terminal and a gate terminal. The first terminal of the transistor M19 may be coupled to the output terminal 621 of the buffer circuit 620. The second terminal of the transistor M19 may be coupled to the second terminal of the transistor M2. The gate terminal of the transistor M19 may receive the clock signal CLK2.

The buffer circuit 620 may include a transistor M3, a transistor M4, a transistor M13, a transistor M14, a capacitor Cb1 and a capacitor Cb2. The transistor M3, the transistor M4 and the capacitor Cb1 are the same as or similar to the transistor M3, the transistor M4 and the capacitor Cb1 in FIG. 8, and this description is not repeated herein.

In the embodiment, the difference between buffer circuit 620 of FIG. 9 and the buffer circuit 620 of FIG. 8 is that the gate terminal of the transistor M13 may be coupled to the output terminal 611 of the latch circuit 610, and the gate terminal of the transistor M14 may be coupled to the output terminal 612 of the latch circuit 610.

In FIG. 9, the pump unit 920 including the capacitor C2, the transistor M16, the transistor M17 and the transistor M18 is one exemplary embodiment of the disclosure, but the embodiment of the disclosure is not limited thereto. In some embodiments, the pump unit 920 may include the capacitor C1 and the transistor M8, as shown in FIG. 5A. The coupling relationship of the capacitor C1 and the transistor M8 is similar to that in the embodiment of FIG. 5A, and the description thereof is not repeated herein. In some embodiments, the pump unit 920 may include the capacitor C1, as shown in FIG. 5B. The coupling relationship of the capacitor C1 is similar to that in the embodiment of FIG. 5B, and the description thereof is not repeated herein. In some embodiments, the pump unit 920 may include the capacitor C1, the transistor M9 and the transistor M10, as shown in FIG. 5C. The coupling relationship of the capacitor C1, the transistor M9 and the transistor M10 is similar to that in the embodiment of FIG. 5C, and the description thereof is not repeated herein.

Figure 10:
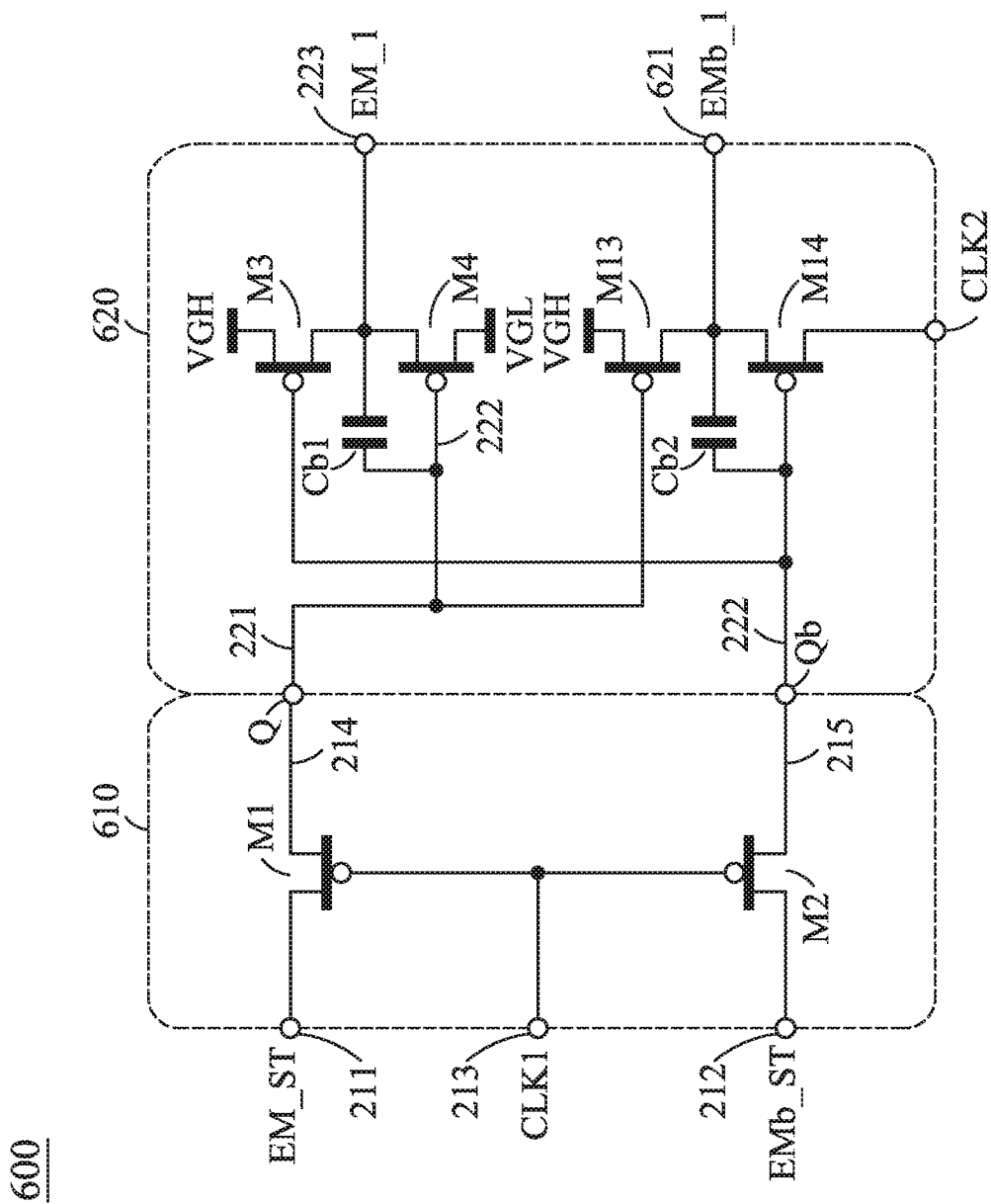
FIG. 10 is another exemplary circuit diagram of the emission driver in FIG. 6.
Figure 11:
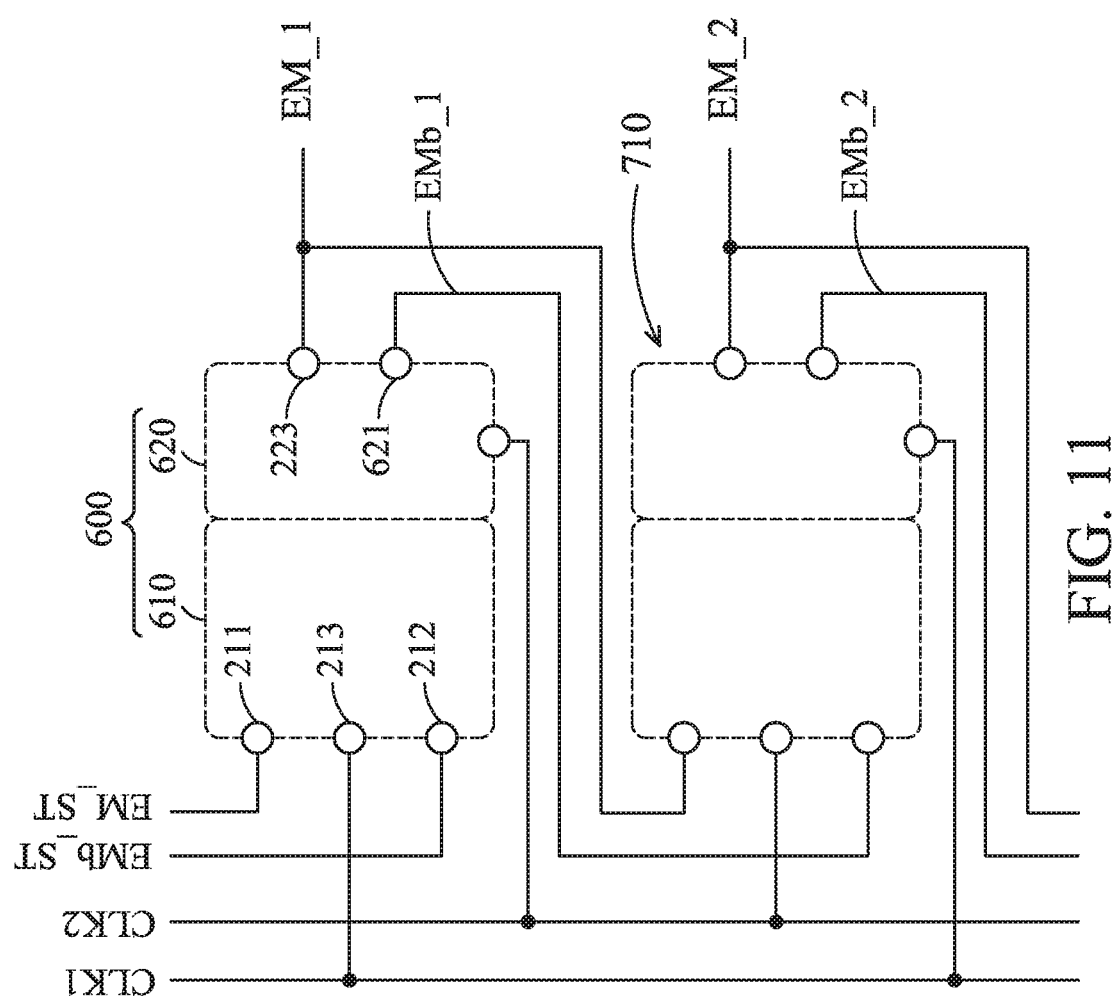
FIG. 11 is another schematic view of the coupling relationship of the emission drivers according to an embodiment of the disclosure.

FIG. 10 is another exemplary circuit diagram of the emission driver in FIG. 6. Please refer to FIG. 10. In the embodiment, the EM driver 600 in FIG. 10 is similar to the EM driver 600 in FIG. 8. The difference between the EM driver 600 in FIG. 10 and the EM driver 600 in FIG. 8 is that the buffer circuit 620 may further receive a clock signal CLK2. The output terminal 621 of the buffer circuit 620 may output a complementary EM signal EMb_1 to another EM driver 710 according to the signal Q, the signal Qb and the clock signal CLK2, as shown in FIG. 11.

The latch circuit 610 may include a transistor M1 and a transistor M2. The transistors M1 and M2 are the same as or similar to the transistors M1 and M2 in FIG. 8, and the description thereof is not repeated herein.

The buffer circuit 620 may include a transistor M3, a transistor M4, a transistor M13 and a transistor M14. The transistor M3, the transistor M4, the transistor M13 are the same as or similar to the transistor M3, the transistor M4, and the transistor M13 in FIG. 8, and the description thereof is not repeated herein.

The transistor M14 has a first terminal, a second terminal and a gate terminal. The first terminal of the transistor M14 may be coupled to the output terminal 621. The second terminal of the transistor M14 may receive the clock signal CLK2. The gate terminal of the transistor M14 may be coupled to the output terminal 215 of the latch circuit 610. The capacitor Cb2 may be coupled between the first terminal and the gate terminal of the transistor M14.

Figure 12:
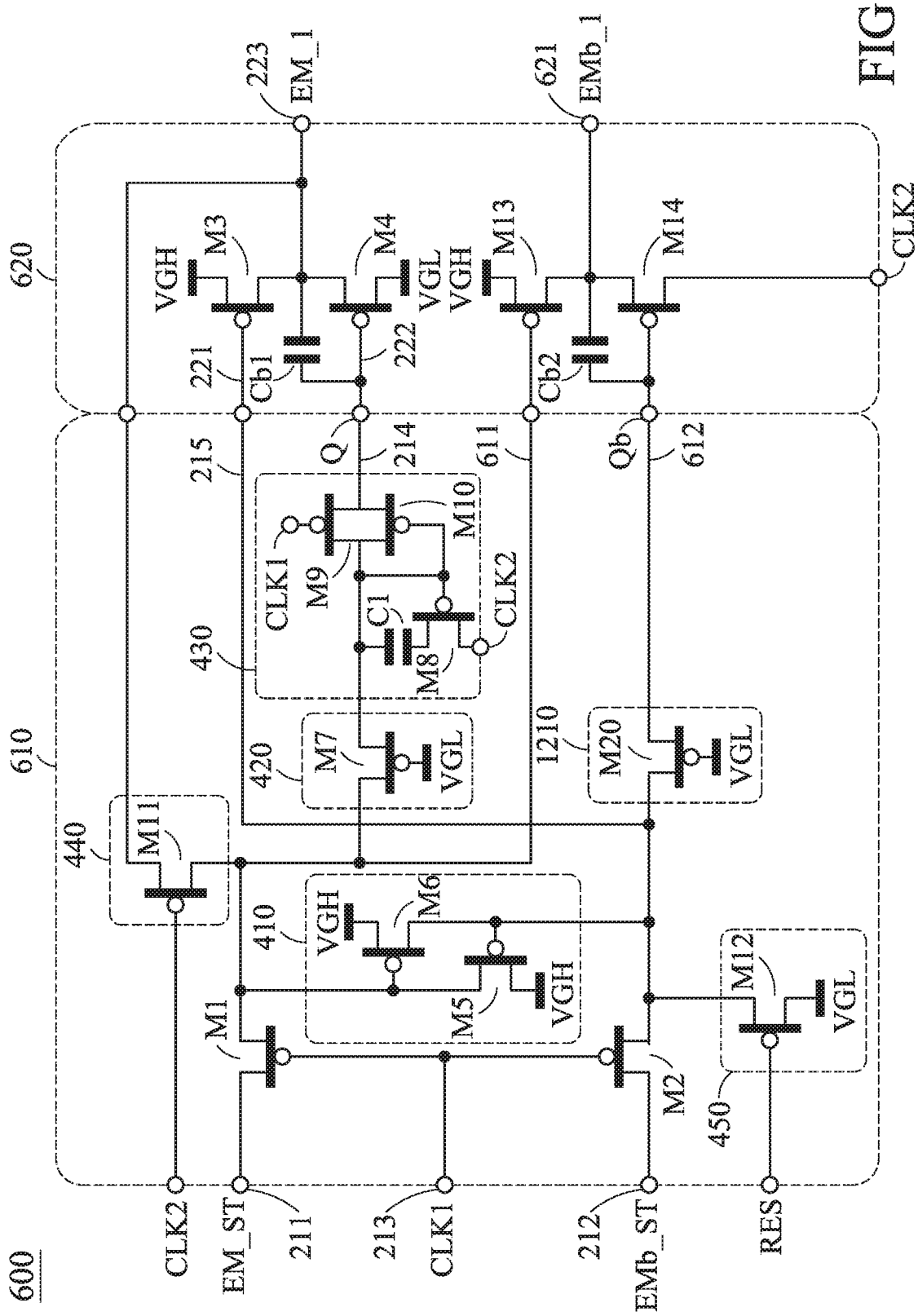
FIG. 12 is another exemplary circuit diagram of the emission driver in FIG. 6.

FIG. 12 is another exemplary circuit diagram of the emission driver in FIG. 6. Please refer to FIG. 12. The latch circuit 610 may further include output terminals 611 and 612. The latch circuit 610 includes a transistor M1, a transistor M2, a pull-up unit 410, a switch 420, a pump unit 430, a feedback switch 440, a reset switch 450 and a switch 1210.

The switch 1210 may be coupled to the second terminal of the transistor M2 and the output terminal 612 of the latch circuit 610. The switch 1210 may be operated to protect the transistor (such as the transistor M2) between the input terminal 212 and the output terminal 612 of the latch circuit 610 to isolate the signal Qb for effective bootstrap.

In the embodiment, the switch 1210 may include a transistor M20. The transistor M20 has a first terminal, a second terminal and a gate terminal. The first terminal of the transistor M20 may be coupled to the second terminal of the transistor M2. The second terminal of the transistor M20 may be coupled to the output terminal 612 of the latch circuit 610. The gate terminal of the transistor M20 may receive the voltage VGL.

The buffer circuit 620 may include a transistor M3, a transistor M4, a transistor M13, a transistor M14, a capacitor Cb1 and a capacitor Cb2. The transistor M3, the transistor M4, the transistor M13, the transistor M14, the capacitor Cb1 and the capacitor Cb2 are the same as or similar to the transistor M3, the transistor M4, the transistor M13, the transistor M14, the capacitor Cb1 and the capacitor Cb2 in FIG. 10, and the description thereof is not repeated herein.

It can be seen from FIG. 12 that the number of components in EM driver 600 may be decreased to decrease the circuit cost or decrease the circuit size (layout area).

FIGS. 13A-13C are schematic views of the operation of the pump unit 430 according to an embodiment of the disclosure. In FIGS. 13A-13C, the signal EM_ST is at the low logic level "L", the clock signal CLK1 and the clock signal CLK2 are complementary. In FIG. 13A, when the clock signal CLK1 is at the low logic level "L" and the clock signal CLK2 is at the high logic level "H", the transistor M1 and the transistor M9 are turned on. Then, the first terminal of the capacitor C1 and the gate terminal of the transistor M8 are at the low logic level "L", and the transistor M8 is turned on. At this time, the transistor M10 is turned off. Then, the low logic level "L" is output by the transistor M9, and the signal Q drops to the low logic level "L".

In FIG. 13B, when the clock signal CLK1 is at the high logic level "H" and the clock signal CLK2 is at the low logic level "L", the transistor M1 and the transistor M9 are turned off, and the first terminal of the capacitor C1 and the gate terminal of the transistor M8 are still the low logic level "L". Since the transistor M8 is still turned on, the second terminal of the capacitor C1 receives the clock signal CLK2 with low logic level "L". Accordingly, by capacitive coupling between the first terminal and the second terminal of the capacitor C1, the first terminal of the capacitor C1 may drop to the extra-low logic level "Extra-L". Since the first terminal of the capacitor C1 is at the extra-low logic level "Extra-L", the transistor M10 is turned on. Then, the extra-low logic level "Extra-L" is output by the transistor M10, and the signal Q becomes the extra-low logic level "Extra-L".

In FIG. 13C, when the clock signal CLK1 is at the low logic level "L" and the clock signal CLK2 is at the high logic level "H", the transistor M1 is turned on and the transistor M9 is turned off. Then, the first terminal of the capacitor C1 and the gate terminal of the transistor M8 are at the low logic level "L", and the transistor M8 is turned on. At this time, the transistor M10 is turned off. Since the transistor M9 and the transistor M10 are turned off, the signal Q still maintains the extra-low logic level "Extra-L".

FIGS. 13D-13F are schematic views of another operation of the pump unit according to an embodiment of the disclosure. In FIGS. 13D-13F, the signal EM_ST is at the high logic level "H", the clock signal CLK1 and the clock signal CLK2 are complementary. In FIG. 13D, when the clock signal CLK1 is at the low logic level "L" and the clock signal CLK2 is at the high logic level "H", the transistor M1 and the transistor M9 are turned on. Then, the first terminal of the capacitor C1 and the gate terminal of the transistor M8 are at the high logic level "H", and the transistor M8 and transistor M10 are turned off. Then, the high logic level "H" is output by the transistor M9, and the signal Q rises to the high logic level "H".

In FIG. 13E, when the clock signal CLK1 is at the high logic level "H" and the clock signal CLK2 is at the low logic level "L", the transistor M1 and the transistor M9 are turned off. The first terminal of the capacitor C1 and the gate terminal of the transistor M8 are still the high logic level "H", and the transistor M8 and transistor M10 are still turned off. Then, the signal Q still maintains the high logic level "H".

In FIG. 13F, when the clock signal CLK1 is at the low logic level "L" and the clock signal CLK2 is at the high logic level "H", the transistor M1 and the transistor M9 are turned on. Then, the first terminal of the capacitor C1 and the gate terminal of the transistor M8 are still the high logic level "H", and the transistor M8 and the transistor M10 are still turned off. Then, the signal Q still maintains the high logic level "H".

Figure 14:
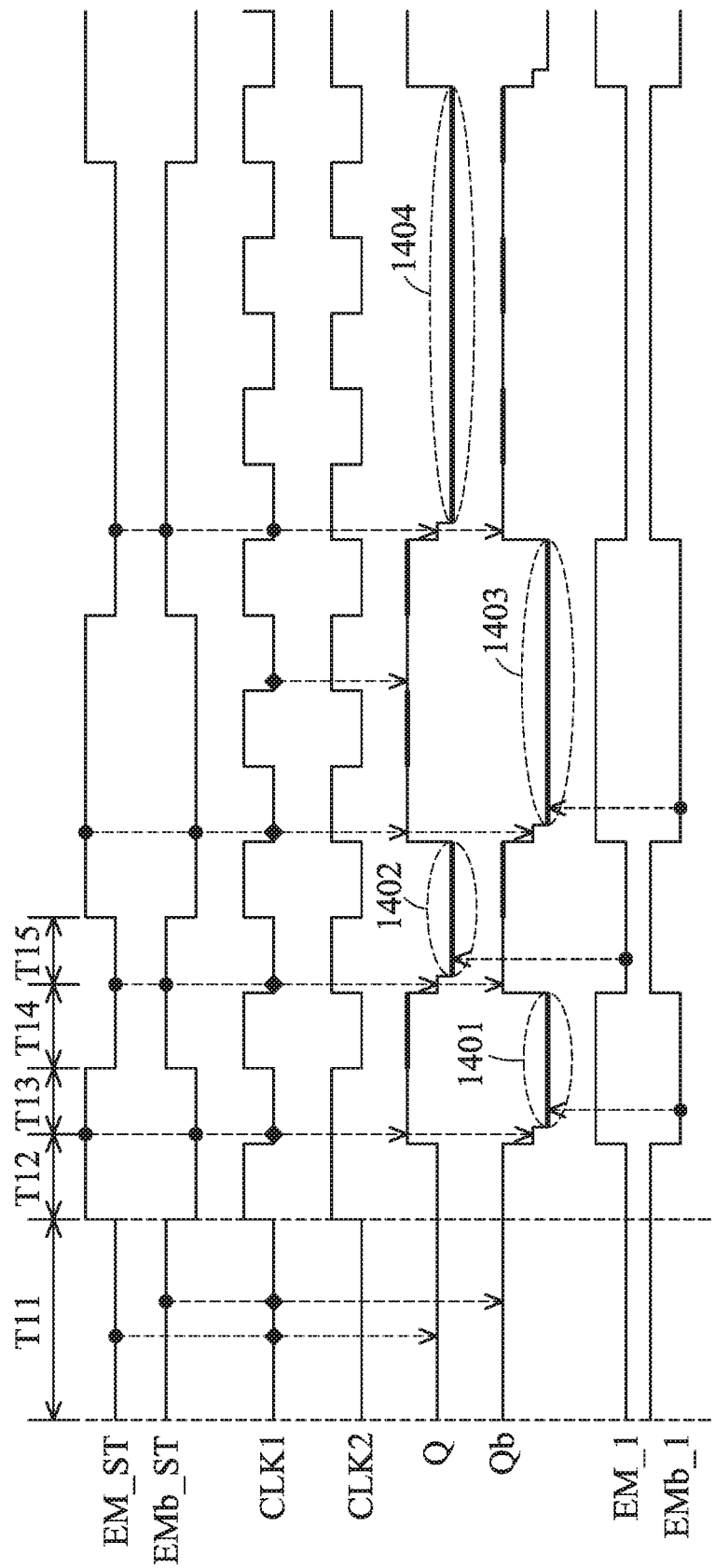
FIG. 14 is a timing diagram of the emission driver according to an embodiment of the disclosure.

FIG. 14 is a timing diagram of the emission driver according to an embodiment of the disclosure. The timing diagram in FIG. 14 may correspond to the EM driver 200 in FIG. 3 and the EM driver 600 in FIG. 8. In FIG. 14, duty cycles of the signal EM_ST and the signal EMb_ST may be gradually increased, but the embodiment of the disclosure is not limited thereto. In some embodiments, the duty cycles of the signal EM_ST and the signal EMb_ST may be fixed. In the embodiment, the signal EMb_ST is a complementary signal in reverse to the signal EM_ST when the EM driver operates in a latch mode (i.e., the clock signal CLK1 is at the low logic level "L").

Please refer to FIGS. 3, 8 and 14. At the time T11 (such as an initialization time), the signal EM_ST is at the low logic level "L", the signal EMb_ST is at the high logic level "H", and the clock signal CLK1 is at the low logic level "L", the transistor M1 and the transistor M2 are turned on. Then, the signal Q is at the low logic level "L" and the signal Qb is at the high logic level "H". Accordingly, the transistor M4 (FIG. 3 and FIG. 8) and the transistor M13 (FIG. 8) are turned on, the transistor M3 (FIG. 3 and FIG. 8) and the transistor M14 (FIG. 8) are turned off, the EM signal EM_1 (FIG. 3 and FIG. 8) is at the low logic level "L", and the complementary EM signal EMb_1 (FIG. 8) is at the high logic level "H".

At time T12, since the clock signal CLK1 is at the high logic level "H", the transistor M1 and the transistor M2 are turned off. Accordingly, the signal Q, the signal Qb, the EM signal EM_1 and the complementary EM signal EMb_1 maintain the same logic level. At the time T13, the signal EM_ST is at the high logic level "H", the signal EMb_ST is at the low logic level "L", and the clock signal CLK1 is at the low logic level "L", the transistor M1 and the transistor M2 are turned on. Then, the signal Q is at the high logic level "H" and the signal Qb is at the low logic level "L". Accordingly, the transistor M3 (FIG. 3 and FIG. 8) and the transistor M14 (FIG. 8) are turned on and the transistor M4 (FIG. 3 and FIG. 8) and the transistor M13 (FIG. 8) are turned off, and the EM signal EM_1 (FIG. 3 and FIG. 8) is at the high logic level "H" and the complementary EM signal EMb_1 (FIG. 8) is at the low logic level "L". Since the capacitor Cb2 (FIG. 8) is a bootstrap capacitor, the signal Qb may decrease a logic level, and the signal Qb (FIG. 8) may maintain the extra-low logic level.

At the time T14, since the clock signal CLK1 is at the high logic level "H", the transistor M1 and the transistor M2 are turned off. Accordingly, the signal Q, the signal Qb, the EM signal EM_1 and the complementary EM signal EMb_1 maintain the same logic level. At the time T15, the signal EM_ST is at the low logic level "L", the signal EMb_ST is at the high logic level "H", and the clock signal CLK1 is at the low logic level "L", the transistors M1 and M2 are turned on. Then, the signal Q is at the low logic level "L" and the signal Qb is at the high logic level "H". Accordingly, the transistor M4 (FIG. 3 and FIG. 8) and the transistor M13 (FIG. 8) are turned on, the transistor M3 (FIG. 3 and FIG. 8) and the transistor M14 (FIG. 8) are turned off, the EM signal EM_1 (FIG. 3 and FIG. 8) is at the low logic level "L", and the complementary EM signal EMb_1 (FIG. 8) is at the high logic level "H". Since the capacitor Cb1 (FIG. 3 and FIG. 8) may be a bootstrap capacitor, the logic level of the signal Q may further decrease a logic level, and the signal Q (FIG. 3 and FIG. 8) may maintain the extra-low logic level. For a description of the remaining times, person having ordinary skill in the art may refer to the above description of times T12~T15, and the description thereof is not repeated herein.

It can be seen from FIG. 14 that when the signal Q or the signal Qb drops to the low logic level, the EM driver 200 or 600 may maintain the signal Q or the signal Qb at the extra-low logic level, as shown by the region 1401, the region 1402, the region 1403, and the region 1404 in FIG. 14. Therefore, the stability of the EM signal EM_1 and the complementary EM signal EMb_1 or the operational stability of the EM driver 200 or the EM driver 600 may be effectively improved.

Figure 15:
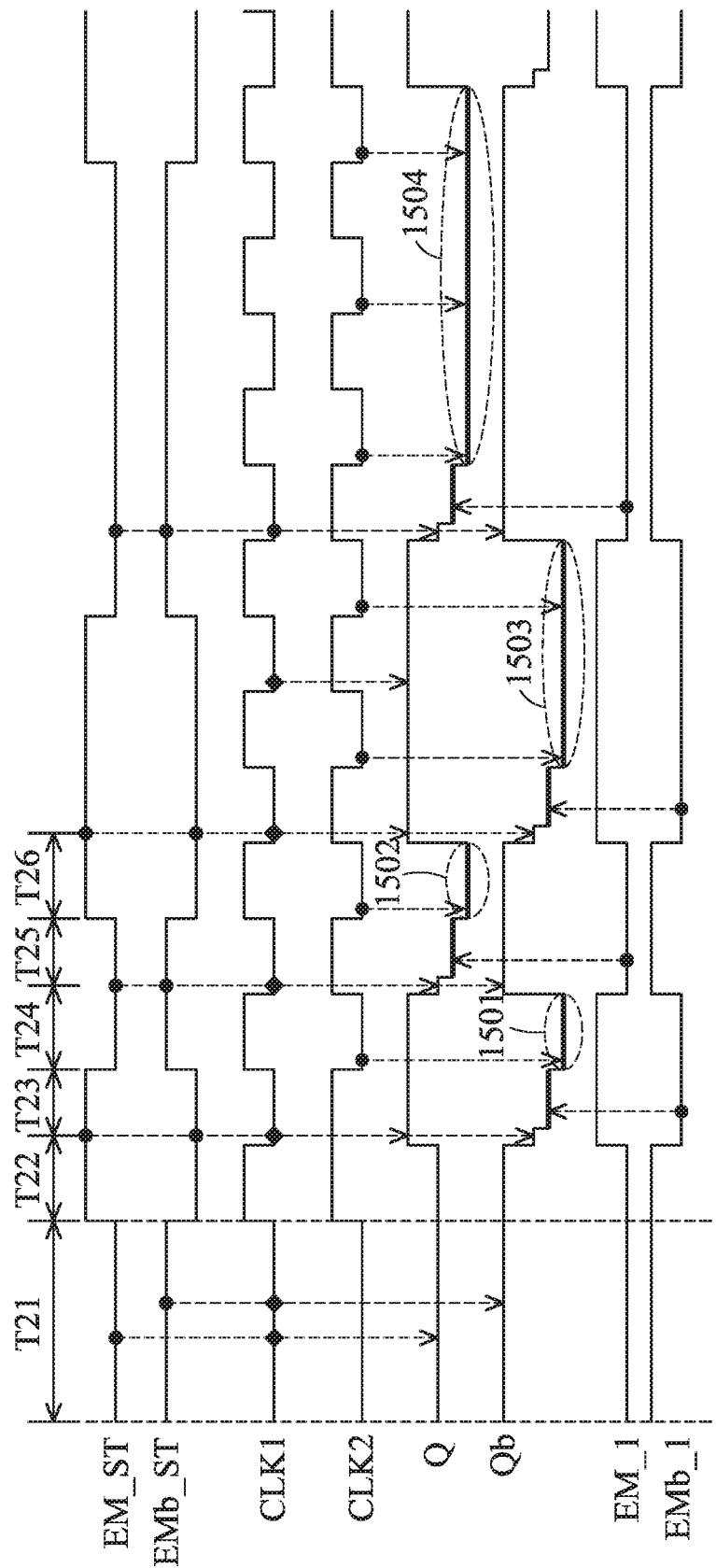
FIG. 15 is another timing diagram of the emission driver according to an embodiment of the disclosure.

FIG. 15 is another timing diagram of the emission driver according to an embodiment of the disclosure. The timing diagram in FIG. 15 may correspond to the EM driver 200 in FIG. 4 and/or the EM driver 600 in FIG. 9. In FIG. 15, duty cycles of the signal EM_ST and the signal EMb_ST may be gradually increased, but the embodiment of the disclosure is not limited thereto. In some embodiments, the duty cycles of the signal EM_ST and the signal EMb_ST may be fixed. In the embodiment, the signal EMb_ST is a complementary signal in reverse to the signal EM_ST when the EM driver operates in a latch mode (i.e., the clock signal CLK1 is at the low logic level "L").

Please refer to FIGS. 4, 9 and 15. At the time T21 (such as an initialization time), the signal EM_ST is at the low logic level "L", the signal EMb_ST is at the high logic level "H", the clock signal CLK1 is at the low logic level "L", and the transistor M1, the transistor M2, the transistor M8 (FIG. 4 and FIG. 9), the transistor M9 (FIG. 4 and FIG. 9), and the transistor M17 (FIG. 9) are turned on. Then, the signal Q is at the low logic level "L" and the signal Qb is at the high logic level "H". Accordingly, the transistor M4 (FIG. 4 and FIG. 9) and the transistor M13 (FIG. 9) are turned on, the transistors M3 (FIG. 4 and FIG. 9) and the transistor M14 (FIG. 9) are turned off, the EM signal EM_1 (FIG. 4 and FIG. 9) is at the low logic level "L", and the complementary EM signal EMb_1 (FIG. 9) is at the high logic level "H".

At the time T22, since the clock signal CLK1 is at the high logic level "H", the transistor M1, the transistor M2, the transistor M9 (FIG. 4 and FIG. 9), and the transistor M17 (FIG. 9) are turned off. Accordingly, the signal Q, the signal Qb, the EM signal EM_1 and the complementary EM signal EMb_1 maintain the same logic level. At time T23, the signal EM_ST is at the high logic level "H", the signal EMb_ST is at the low logic level "L", and the clock signal CLK1 is at the low logic level "L", the transistor M1, the transistor M2, the transistor M9 (FIG. 4 and FIG. 9), the transistor M16 (FIG. 9) and the transistor M17 (FIG. 9) are turned on. Then, the signal Q is at the high logic level "H" and the signal Qb is at the low logic level "L". Accordingly, the transistor M3 (FIG. 4 and FIG. 9) and the transistor M14 (FIG. 9) are turned on, the transistor M4 (FIG. 4 and FIG. 9) and the transistor M13 (FIG. 9) are turned off, the EM signal EM_1 (FIG. 4 and FIG. 9) is at the high logic level "H", and the complementary EM signal EMb_1 (FIG. 9) is at the low logic level "L". Since the capacitor Cb2 (FIG. 9) may be a bootstrap capacitor, the logic level of the signal Qb may further decrease a logic level and the signal Qb (FIG. 9) may maintain the extra-low logic level.

At the time T24, since the clock signal CLK1 is at the high logic level "H", the transistor M1, the transistor M2, the transistor M9 (FIG. 4 and FIG. 9), and the transistor M17 (FIG. 9) are turned off. Accordingly, the signal Q and the EM signal EM_1 maintain the same logic level. At this time, since the transistor M16 is turned on and the clock signal CLK2 is at the low logic level "L", by capacitive coupling with the capacitor C2, the first terminal of the capacitor C2 may drop to the extra-low logic level "Extra-L", as shown in FIG. 13B. Since the first terminal of the capacitor C2 is at the extra-low logic level "Extra-L", the transistor M18 is turned on. Then, the extra-low logic level "Extra-L" is output by the transistor M18, and the signal Qb may decrease another logic level, as shown by a region 1501 in FIG. 15. Therefore, the signal Qb may further maintain at the extra-low logic level to improve the stability of the complementary EM signal EMb_1 or the operational stability of the EM driver 200 or the EM driver 600.

At the time T25, the signal EM_ST is at the low logic level "L", the signal EMb_ST is at the high logic level "H", the clock signal CLK1 is at the low logic level "L", and the transistor M1, the transistor M2, the transistor M8 (FIG. 4 and FIG. 9), the transistor M9 (FIG. 4 and FIG. 9), and the transistor M17 (FIG. 9) are turned on. Then, the signal Q is at the low logic level "L" and the signal Qb is at the high logic level "H". Accordingly, the transistor M4 (FIG. 4 and FIG. 9) and the transistor M13 (FIG. 9) are turned on and the transistors M3 (FIG. 4 and FIG. 9) and the transistor M14 (FIG. 9) are turned off, the EM signal EM_1 (FIG. 4 and FIG. 9) is at the low logic level "L", and the complementary EM signal EMb_1 (FIG. 9) is at the high logic level "H". Since the capacitor Cb1 (FIG. 4 and FIG. 9) may be a bootstrap capacitor, the signal Q may decrease a logic level, and the signal Q (FIG. 4 and FIG. 9) may maintain the extra-low logic level.

At the time T26, since the clock signal CLK1 is at the high logic level "H", the transistor M1, the transistor M2, the transistor M9 (FIG. 4 and FIG. 9), and the transistor M17 (FIG. 9) are turned off. Accordingly, the signal Qb and the complementary EM signal EMb_1 maintain the same logic level. At this time, since the transistor M8 is turned on and the clock signal CLK2 is at the low logic level "L", by capacitive coupling with capacitor C1, the first terminal of the capacitor C1 drops to the extra-low logic level "Extra-L", as shown in FIG. 13B. Since the first terminal of the capacitor C1 is at the extra-low logic level "Extra-L", the transistor M10 is turned on. Then, the extra-low logic level "Extra-L" is output by the transistor M10, and the signal Q may decrease another logic level, as shown by a region 1502 in FIG. 15. Therefore, the signal Q may further maintain at the extra-low logic level to improve the stability of the complementary EM signal EMb_1 or the operational stability of the EM driver 200 or the EM driver 600. For a description of the remaining times, person having ordinary skill in the art may refer to the above description of times T22~T26, and the description thereof is not repeated herein.

It can be seen from FIG. 15 that when the signal Q or the signal Qb drops to the low logic level, the EM driver 200 or the EM driver 600 may maintain the signal Q or the signal Qb at the extra-low logic level, as shown by the region 1501, the region 1502, the region 1503, and the region 1504 in FIG. 15 thanks to the pump unit 430 and the pump unit 920. Therefore, the stability of the EM signal EM_1 and the complementary EM signal EMb_1 or the operational stability of the EM driver 200 or the EM driver 600 may be effectively improved.

Figure 16:
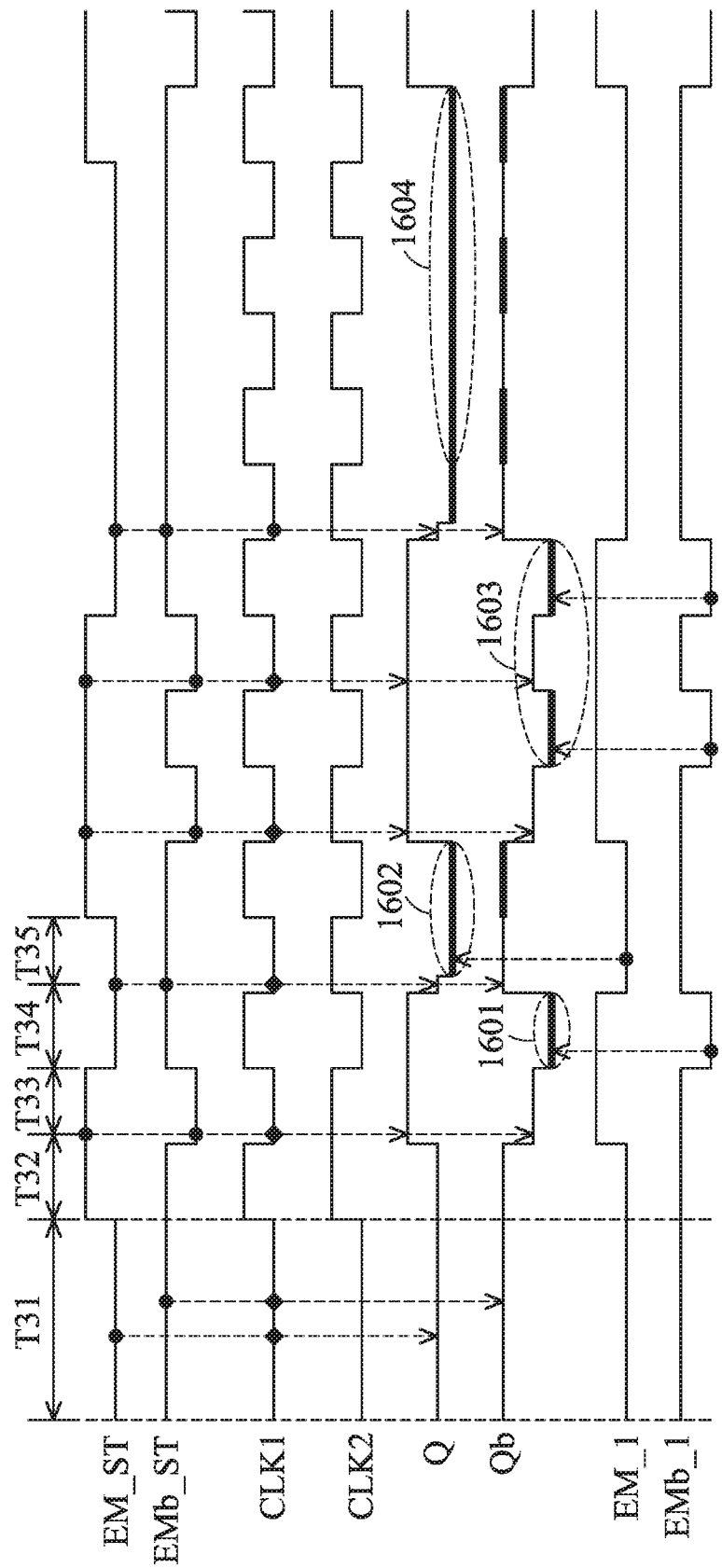
FIG. 16 is another timing diagram of the emission driver according to an embodiment of the disclosure.

FIG. 16 is another timing diagram of the emission driver according to an embodiment of the disclosure. The timing diagram in FIG. 16 may correspond to the EM driver 600 in FIG. 10. In FIG. 16, duty cycles of the signal EM_ST and the signal EMb_ST may be gradually increased, but the embodiment of the disclosure is not limited thereto. In some embodiments, the duty cycles of the signal EM_ST and the signal EMb_ST may be fixed. In the embodiment, the signal EMb_ST is a complementary signal in reverse to the signal EM_ST when the EM driver operates in a latch mode (i.e., the clock signal CLK1 is at the low logic level "L").

Please refer to FIGS. 10 and 16. The operation of the time T31 and the time T32 is the same as or similar to the operation of the time T11 and the time T12, and the description thereof is not repeated herein.

At the time T33, the signal EM_ST is at the high logic level "H", the signal EMb_ST is at the low logic level "L", the clock signal CLK1 is at the low logic level "L" and the clock signal CLK2 is at the high logic level "H", the transistor M1 and the transistor M2 are turned on. Then, the signal Q is at the high logic level "H" and the signal Qb is at the low logic level "L". Accordingly, the transistor M3 and the transistor M14 are turned on, the transistor M4 and the transistor M13 are turned off, the EM signal EM_1 is at the high logic level "H", and the complementary EM signal EMb_1 is at the high logic level "H".

At the time T34, since the clock signal CLK1 is at the high logic level "H", the transistor M1 and the transistor M2 are turned off. Accordingly, the signal Q and the EM signal EM_1 maintain the same logic level. At this time, the transistor M14 is still turned on and the clock signal CLK2 is at the low logic level "L", and the complementary EM signal EMb_1 drops to the low logic level "L". Since the capacitor Cb2 may be a bootstrap capacitor, the signal Qb may decrease a logic level, and the signal Qb may maintain the extra-low logic level as shown by a region 1601 in FIG. 16.

At the time T35, the signal EM_ST is at the low logic level "L", the signal EMb_ST is at the high logic level "H", the clock signal CLK1 is at the low logic level "L", the clock signal CLK2 is at the high logic level "H", and the transistor M1 and the transistor M2 are turned on. Then, the signal Q is at the low logic level "L" and the signal Qb is at the high logic level "H". Accordingly, the transistor M4 and the transistor M13 are turned on and the transistor M3 and the transistor M14 are turned off, the EM signal EM_1 is at the low logic level "L", and the complementary EM signal EMb_1 is at the high logic level "H". Since the capacitor Cb1 may be a bootstrap capacitor, the signal Q may decrease a logic level, and the signal Q may maintain the extra-low logic level, as shown by a region 1602 in FIG. 16. For a description of the remaining times, person having ordinary skill in the art may refer to the above description of times T32~T35, and the description thereof is not repeated herein.

It can be seen from FIG. 16 that when the signal Q or the signal Qb drops to the low logic level, the EM driver 600 may maintain the signal Q or the signal Qb at the extra-low logic level, as shown by the region 1601, the region 1602, the region 1603, the region 1604 in FIG. 16. Therefore, the stability of the EM signal EM_1 and the complementary EM signal EMb_1 or the operational stability of the EM driver 600 may be effectively improved.

Figure 17:
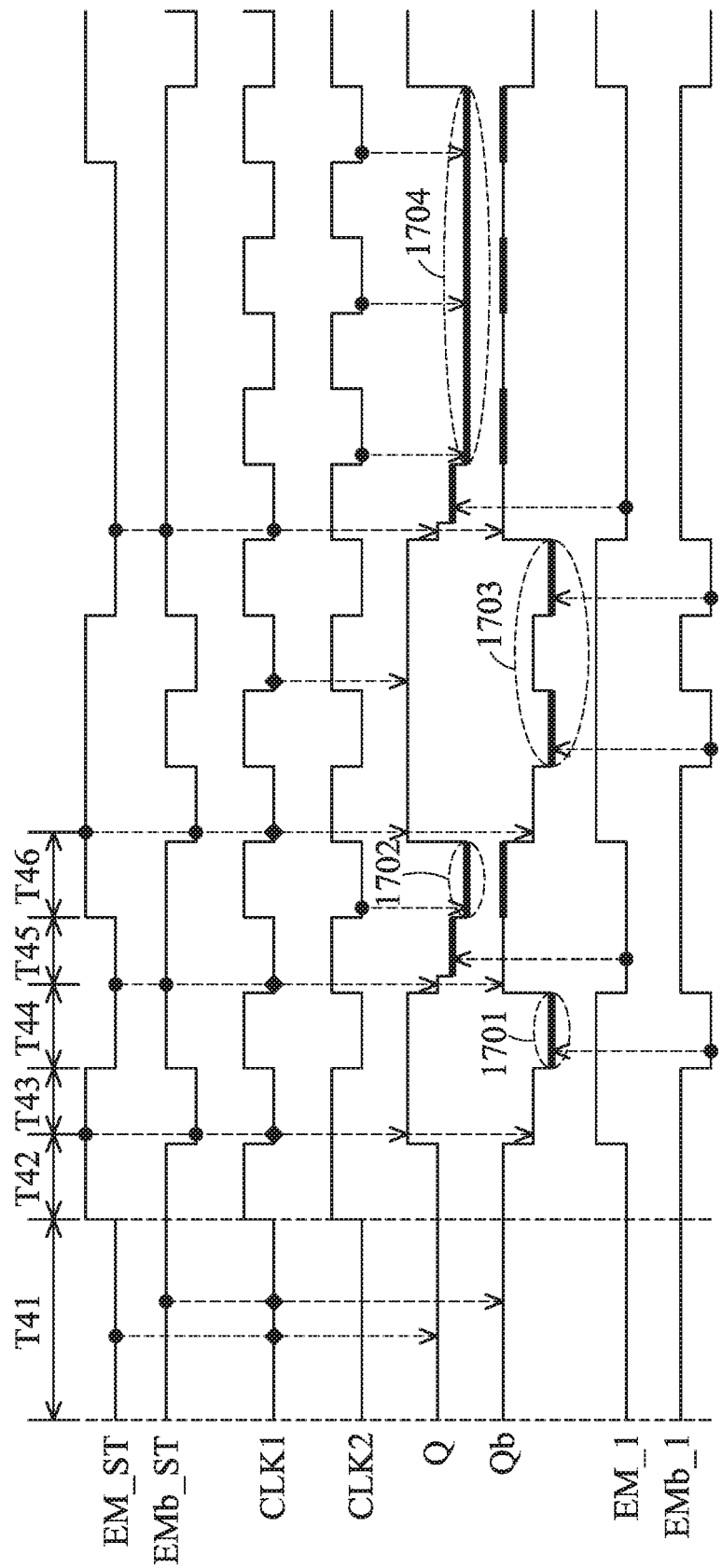
FIG. 17 is another timing diagram of the emission driver according to an embodiment of the disclosure.

FIG. 17 is another timing diagram of the emission driver according to an embodiment of the disclosure. The timing diagram in FIG. 17 may correspond to the EM driver 600 in FIG. 12. In FIG. 17, duty cycles of the signal EM_ST and the signal EMb_ST may be gradually increased, but the embodiment of the disclosure is not limited thereto. In some embodiments, the duty cycles of the signal EM_ST and the signal EMb_ST may be fixed. In the embodiment, the signal EMb_ST is a complementary signal in reverse to the signal EM_ST when the EM driver operates in a latch mode (i.e., the clock signal CLK1 is at the low logic level "L").

Please refer to FIGS. 12 and 17. At the time T41 (such as an initialization time), the signal EM_ST is at the low logic level "L", the signal EMb_ST is at the high logic level "H", the clock signal CLK1 is at the low logic level "L", and the transistor M1, the transistor M2, the transistor M8 and the transistor M9 are turned on. Then, the signal Q is at the low logic level "L" and the signal Qb is at the high logic level "H". Accordingly, the transistor M4 and the transistor M13 are turned on, the transistor M3 and the transistor M14 are turned off, the EM signal EM_1 is at the low logic level "L", and the complementary EM signal EMb_1 is at the high logic level "H".

At the time T42, since the clock signal CLK1 is at the high logic level "H", the transistor M1, the transistor M2 and the transistor M9 are turned off. Accordingly, the signal Q, the signal Qb, the EM signal EM_1 and the complementary EM signal EMb_1 maintain the same logic level. At the time T43, the signal EM_ST is at the high logic level "H", the signal EMb_ST is at the low logic level "L", the clock signal CLK1 is at the low logic level "L", the clock signal CLK2 is the high logic level, and the transistor M1, the transistor M2 and the transistor M9 are turned on. Then, the signal Q is at the high logic level "H" and the signal Qb is at the high logic level "L".

At the time T44, since the clock signal CLK1 is at the high logic level "H", the transistor M1, the transistor M2 and the transistor M9 are turned off. Accordingly, the signal Q and the EM signal EM_1 maintain the same logic level. At this time, the transistor M14 is still turned on and the clock signal CLK2 is at the low logic level "L", and the complementary EM signal EMb_1 drops to the low logic level "L". Since the capacitor Cb2 may be a bootstrap capacitor, the signal Qb may decrease a logic level, and the signal Qb may maintain the extra-low logic level as shown by a region 1701 in FIG. 17.

At the time T45, the signal EM_ST is at the low logic level "L", the signal EMb_ST is at the high logic level "H", the clock signal CLK1 is at the low logic level "L", the clock signal CLK2 is at the high logic level "H", and the transistor M1, the transistor M2, the transistor M8 and the transistor M9 are turned on. Then, the signal Q is at the low logic level "L" and the signal Qb is at the high logic level "H". Accordingly, the transistor M4 and the transistor M13 are turned on and the transistor M3 and the transistor M14 are turned off, the EM signal EM_1 is at the low logic level "L", and the complementary EM signal EMb_1 is at the high logic level "H". Since the capacitor Cb1 may be a bootstrap capacitor, the signal Q may decrease a logic level, and the signal Q may maintain the extra-low logic level.

At the time T46, since the clock signal CLK1 is at the high logic level "H", the transistor M1, the transistor M2 and the transistor M9 are turned off. Accordingly, the signal Qb and the complementary EM signal EMb_1 maintain the same logic level. At this time, since the transistor M8 is turned on and the clock signal CLK2 is at the low logic level "L", by capacitive coupling with the capacitor C1, the first terminal of the capacitor C1 drops to the extra-low logic level "Extra-L", as shown in FIG. 13B. Since the first terminal of the capacitor C1 is at the extra-low logic level "Extra-L", the transistor M10 is turned on. Then, the extra-low logic level "Extra-L" is output by the transistor M10, and the signal Q may decrease another logic level, as shown by a region 1702 in FIG. 17. Therefore, the signal Q may further maintain at the extra-low logic level to improve the stability of the EM signal EM_1 or the operational stability of the EM driver 600. For a description of the remaining times, person having ordinary skill in the art may refer to the above description of times T42~T46, and the description thereof is not repeated herein.

It can be seen from FIG. 17 that when the signal Q or the signal Qb drops to the low logic level, the EM driver 600 may maintain the signal Q or the signal Qb at the extra-low logic level, as shown by the region 1701, the region 1702, the region 1703, and the region 1704 in FIG. 17. Therefore, the stability of the EM signal EM_1 and the complementary EM signal EMb_1 or the operational stability of the EM driver 600 may be effectively improved.

In the above embodiments, the EM driver 200 or the EM driver 600 uses the pump unit 430, but the embodiment of the disclosure is not limited thereto. The pump unit 430 may be used in other EM drivers, and the same effect may be achieved.

Figure 18:
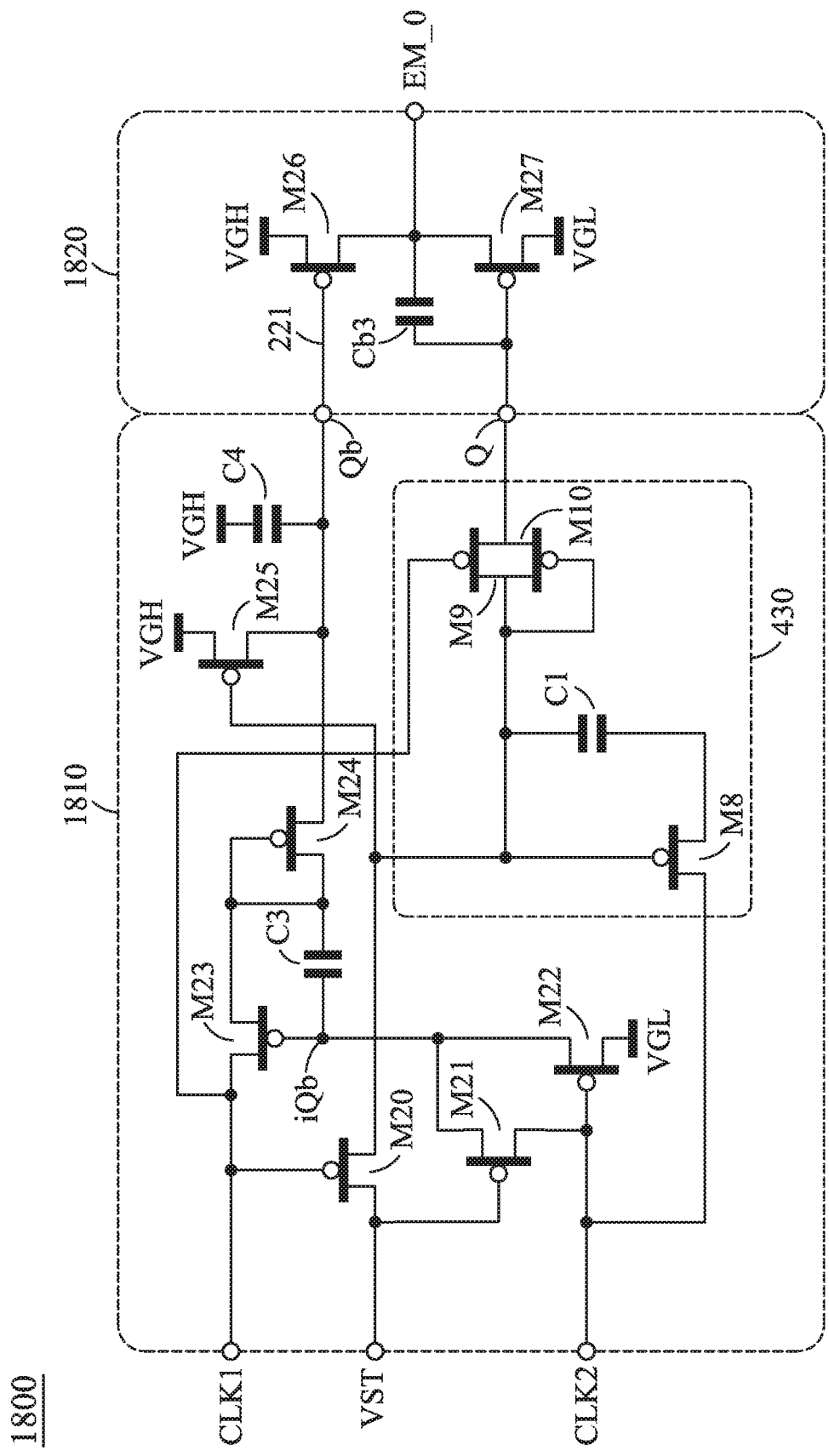
FIG. 18 is another schematic view of an emission driver according to an embodiment of the disclosure.

FIG. 18 is another schematic view of an emission driver according to an embodiment of the disclosure. Please refer to FIG. 18. The EM driver 1800 may include a latch circuit 1810 and a buffer circuit 1820. The latch circuit 1810 generates a signal Q and a signal Qb in reserve to the signal Q according to a signal VST, a clock signal CLK1 and a clock signal CLK2. The buffer circuit 1820 generates an EM signal EM_0 according to the signal Q and signal Qb.

In addition, the latch circuit 1810 includes a transistor M20, a transistor M21, a transistor M22, a transistor M23, a transistor M24, a transistor M25, a capacitor C3, a capacitor C4, and a pump unit 430. The coupling relationship of the transistor M20, the transistor M21, the transistor M22, the transistor M23, the transistor M24, the transistor M25, the capacitor C3, the capacitor C4, and the pump unit 430 is illustrated in FIG. 18, and the description thereof is not repeated herein. The operation of the pump unit 430 is illustrated in FIGS. 13A-13F, and the description thereof is not repeated herein.

Furthermore, the buffer circuit 1820 may include a transistor M26, a transistor M27, and a capacitor Cb3. The coupling relationship of the transistors M26~M27 and the capacitor Cb3 is illustrated in FIG. 18, and the description thereof is not repeated herein. Therefore, the signal Q may further maintain at the extra-low logic level to improve the stability of the EM signal EM_0 or the operational stability of the EM driver 1800.

Figure 19:
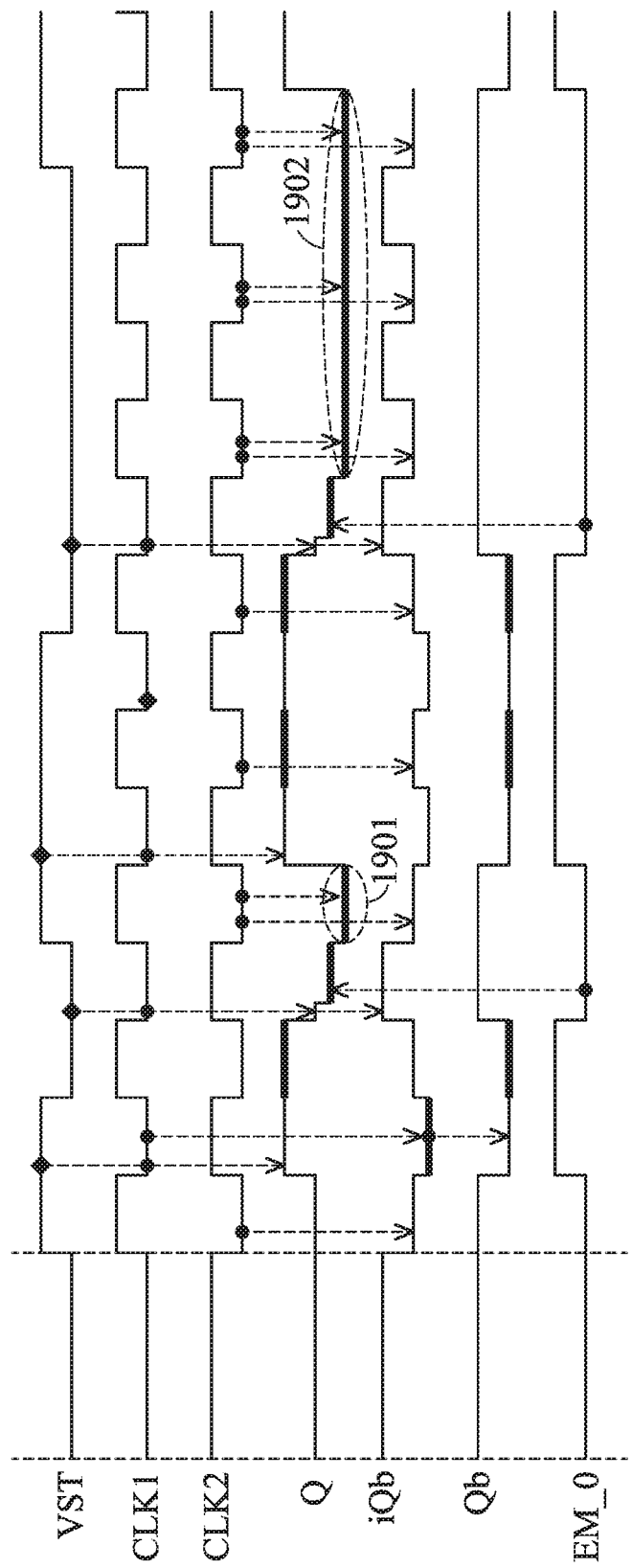
FIG. 19 is another timing diagram of the emission driver according to an embodiment of the disclosure.

FIG. 19 is another timing diagram of the emission driver according to an embodiment of the disclosure. The timing diagram in FIG. 19 may correspond to the EM driver 1800 in FIG. 18. In FIG. 19, a duty cycle of the signal EM_0 may be gradually increased, but the embodiment of the disclosure is not limited thereto. In some embodiments, the duty cycle of the signal EM_0 may be fixed.

It can be seen from FIG. 19 that when the signal Q drops to the low logic level, the EM driver 1800 may maintain the signal Q at the extra-low logic level, as shown by the region 1901, and the region 1902 in FIG. 19. Therefore, the stability of the EM signal EM_0 or the operational stability of the EM driver 1800 may be effectively improved.

Figure 20:
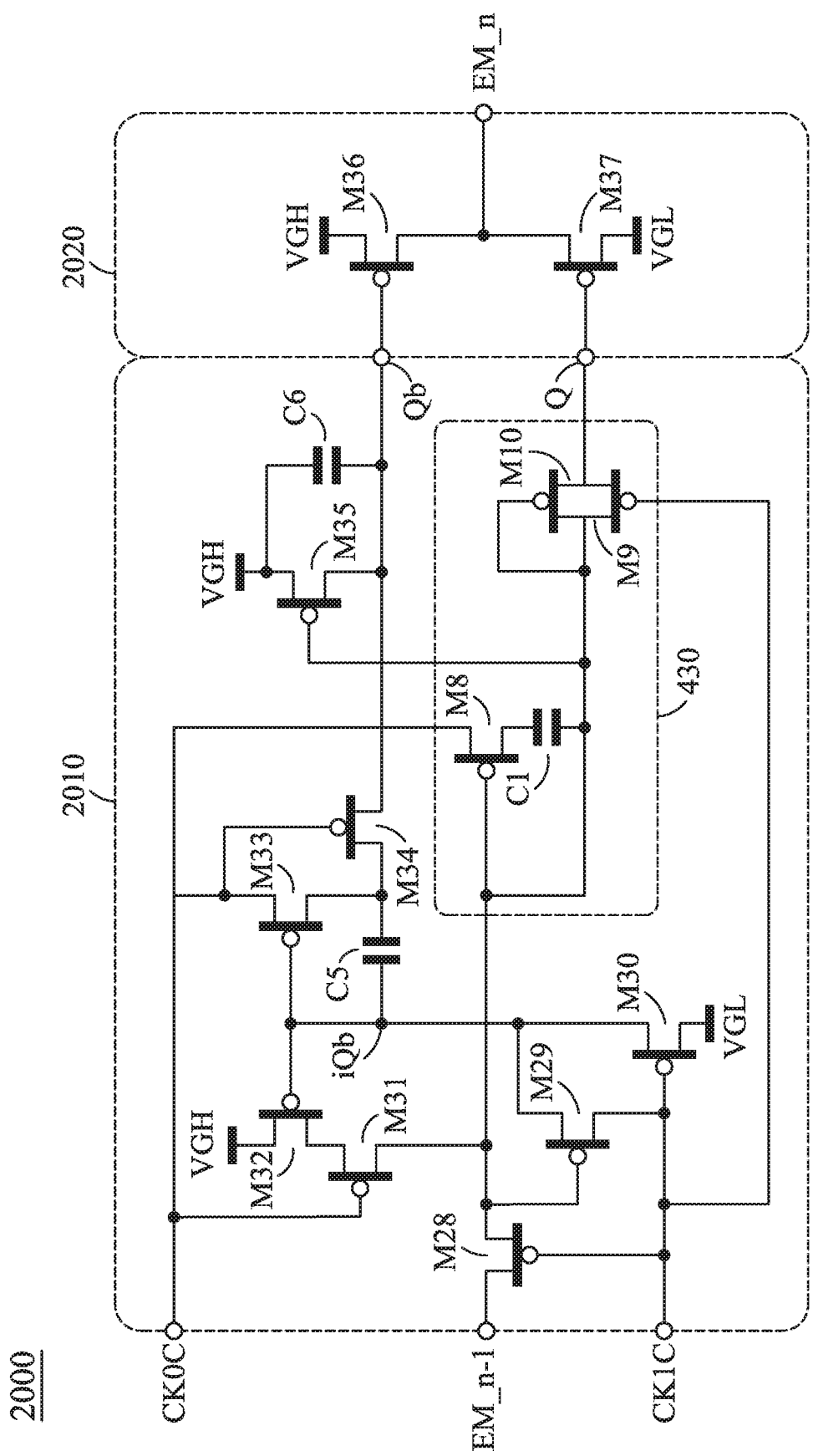
FIG. 20 is another schematic view of an emission driver according to an embodiment of the disclosure.

FIG. 20 is another schematic view of an emission driver according to an embodiment of the disclosure. Please refer to FIG. 20. The EM driver 2000 may include a latch circuit 2010 and a buffer circuit 2020. The latch circuit 2010 generates a signal Q and a signal Qb in reserve to the signal Q according to a signal EM_n−1, a clock signal CKOC and CK1C. The buffer circuit 2020 generates an EM signal EM_n according to the signal Q and signal Qb.

In addition, the latch circuit 2010 includes a transistor M28, a transistor M29, a transistor M30, a transistor M31, a transistor M32, a transistor M33, a transistor M34, a transistor M35, a capacitor C5, a capacitor C6 and a pump unit 430. The coupling relationship of the transistor M28, the transistor M29, the transistor M30, the transistor M31, the transistor M32, the transistor M33, the transistor M34, the transistor M35, the capacitor C5, the capacitor C6 and the pump unit 430 are illustrated in FIG. 20, and the description thereof is not repeated herein. The operation of the pump unit 430 is illustrated in FIGS. 13A~13F, and the description thereof is not repeated herein.

Furthermore, the buffer circuit 2020 includes a transistor M36 and a transistor M37. The coupling relationship of the transistor M36 and the transistor M37 is illustrated in FIG. 20, and the description thereof is not repeated herein. Therefore, the logic level of the signal Q may further maintain at the extra-low logic level to improve the stability of the EM signal EM_n or the operational stability of the EM driver 2000.

Figure 21:
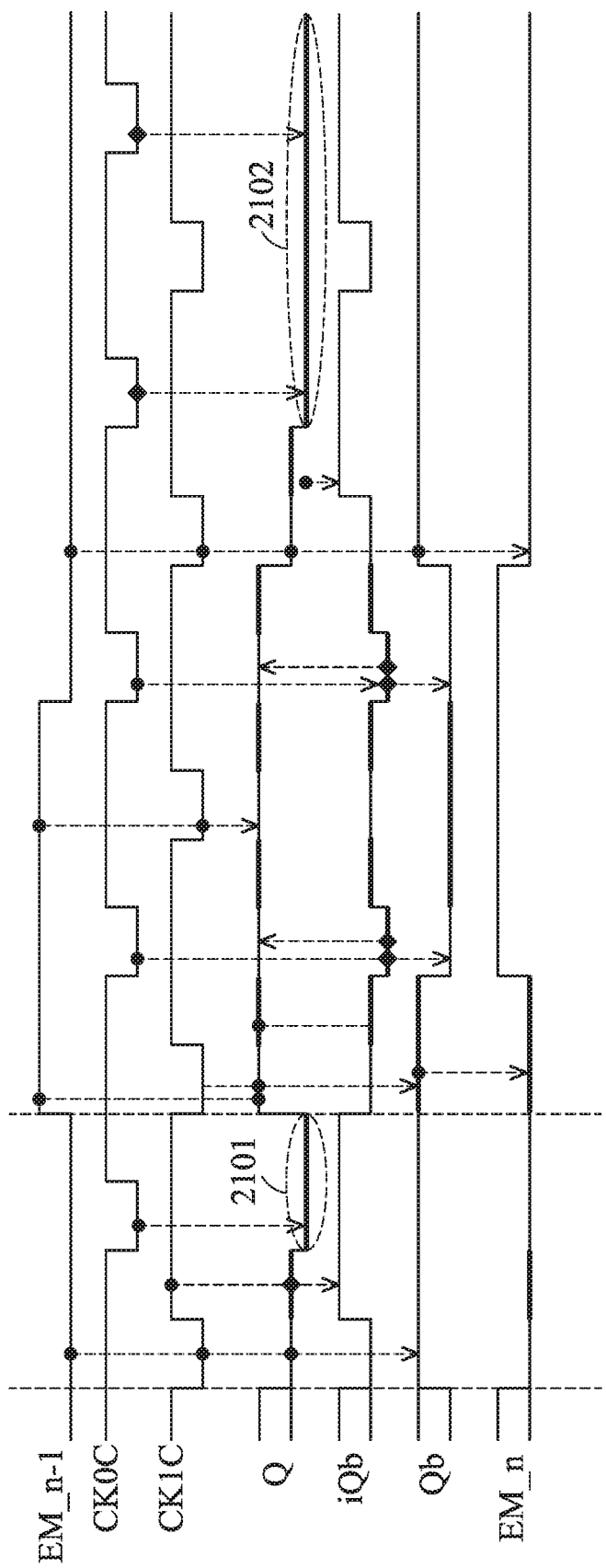
FIG. 21 is another timing diagram of the emission driver according to an embodiment of the disclosure.

FIG. 21 is another timing diagram of the emission driver according to an embodiment of the disclosure. The timing diagram in FIG. 21 may correspond to the EM driver 2000 in FIG. 20. In FIG. 21, a duty cycle of the signal EM_n−1 may be gradually increased, but the embodiment of the disclosure is not limited thereto. In some embodiments, the duty cycle of the signal EM_n−1 may be fixed.

It can be seen from FIG. 21 that when the signal Q drops to the low logic level, the EM driver 2000 may maintain the signal Q at the extra-low logic level, as shown by regions 2101, 2102 in FIG. 21. Therefore, the stability of the EM signal EM_n or the operational stability of the EM driver 2000 may be effectively improved.

In summary, according to the EM driver and the pump unit in the disclosure, the latch circuit receives a first signal, a second signal, and a first clock signal and outputs a third signal according to the first clock signal and a fourth signal in reverse to the third signal according to the first clock signal. The buffer circuit receives the third signal and the fourth signal, and outputs the EM signal according to the third signal and the fourth signal. In addition, when the third signal drops to the low logic level, the pump unit may maintain the signal at the extra-low logic level Therefore, the stability of EM signal or the operational stability of the EM driver may be effectively increased.

While the disclosure has been described by way of examples and in terms of the preferred embodiments, it should be understood that the disclosure is not limited to the disclosed embodiments. On the contrary, it is intended to cover various modifications, combinations, and similar arrangements (as would be apparent to those skilled in the art). Therefore, the scope of the appended claims should be accorded the broadest interpretation to encompass all such modifications, combinations, and similar arrangements.

What is claimed is:

1. An emission driver, comprising:
    a latch circuit receiving a first signal, a second signal, and a first clock signal, the latch circuit comprising:
    a first output terminal for outputting a third signal according to the first clock signal; and
    a second output terminal for outputting a fourth signal in reverse to the third signal according to the first clock signal; and
    a buffer circuit, comprising:
    a first input terminal for receiving the third signal;
    a second input terminal for receiving the fourth signal;
    a third output terminal for outputting an emission signal according to the third signal and the fourth signal; and
    a fourth output terminal for outputting a complementary emission signal in reverse to the emission signal to another emission driver according to the third signal and the fourth signal.

2. The emission driver according to claim 1, wherein the latch circuit further comprises:
    a first transistor having a first terminal for receiving the first signal, a second terminal coupled to the first output terminal, and a first gate terminal for receiving the first clock signal; and a second transistor having a third terminal for receiving the second signal, a fourth terminal coupled to the second output terminal, and a second gate terminal for receiving the first clock signal.

3. The emission driver according to claim 2, wherein the latch circuit further comprises a switch coupled between the second terminal of the first transistor and the first output terminal.

4. The emission driver according to claim 3, wherein the switch comprises a third transistor having a fifth terminal coupled to the second terminal of the first transistor, a sixth terminal coupled to the first output terminal, a third gate terminal for receiving a second voltage lower or higher than a first voltage.

5. The emission driver according to claim 2, wherein the latch circuit further comprises a pump unit coupled between the second terminal of the first transistor and the first output terminal.

6. The emission driver according to claim 5, wherein the pump unit comprises:
 a capacitor, having a first terminal coupled to the second terminal of the first transistor and a second terminal;
 a fourth transistor, having a seventh terminal coupled to the second terminal of the capacitor, an eighth terminal for receiving a second clock signal, and a fourth gate terminal coupled to the first terminal of the capacitor;
 a fifth transistor, having a ninth terminal coupled to the first terminal of the capacitor, a tenth terminal coupled to the first output terminal, and a fifth gate terminal for receiving the first clock signal; and
 a sixth transistor, having an eleventh terminal coupled to the ninth terminal of the fifth transistor, a twelfth terminal coupled to the tenth terminal of the fifth transistor, and a sixth gate terminal coupled to the eleventh terminal of the sixth transistor.

7. The emission driver according to claim 2, wherein the latch circuit further comprises a feedback switch coupled between the second terminal of the first transistor and the third output terminal.

8. The emission driver according to claim 7, wherein the feedback switch comprises a seventh transistor having a thirteenth terminal coupled to the third output terminal, a fourteenth terminal coupled to the second terminal of the first transistor, and a seventh gate terminal for receiving a second clock signal.

9. The emission driver according to claim 1, wherein the buffer circuit further comprises:
 an eighth transistor having a fifteenth terminal for receiving a first voltage, a sixteenth terminal coupled to the third output terminal, and an eighth gate terminal coupled to the second output terminal; and
 a ninth transistor having a seventeenth terminal coupled to the third output terminal, an eighteenth terminal receiving a second voltage lower or higher than the first voltage, and a ninth gate terminal coupled to the first output terminal.

10. The emission driver according to claim 9, wherein the buffer circuit further comprises:
 a tenth transistor having a nineteenth terminal for receiving the first voltage, a twentieth terminal coupled to the fourth output terminal, and a tenth gate terminal coupled to the first output terminal; and
 an eleventh transistor having a twenty-first terminal coupled to the fourth output terminal, a twenty-second terminal, and an eleventh gate terminal coupled to the second output terminal.

11. The emission driver according to claim 10, wherein the twenty-second terminal of the eleventh transistor receives the second voltage.

12. The emission driver according to claim 10, wherein the twenty-second terminal of the eleventh transistor receives a second clock signal.

13. The emission driver according to claim 1, wherein the latch circuit further comprises a pull-up unit coupled to the first output terminal and the second output terminal.

14. The emission driver according to claim 13, wherein the pull-up unit comprises:
 a twelfth transistor having a twenty-third terminal for receiving a first voltage, a twenty-fourth terminal coupled to the first output terminal, and a twelfth gate terminal coupled to the second output terminal; and
 a thirteenth transistor having a twenty-fifth terminal for receiving the first voltage, a twenty-sixth terminal coupled to the twelfth gate terminal of the twelfth transistor, and a thirteenth gate terminal coupled to the twenty-fourth terminal of the twelfth transistor.

15. The emission driver according to claim 1, wherein the latch circuit further comprises a reset switch coupled to the second output terminal.

16. The emission driver according to claim 15, wherein the reset switch comprises a fourteenth transistor having a twenty-seventh terminal coupled to the second output terminal, a twenty-eighth terminal for receiving a second voltage lower or higher than a first voltage, and a fourteenth gate terminal for receiving a reset signal.

17. The emission driver according to claim 1, wherein the second signal is a complementary signal in reverse to the first signal when the emission driver operates in a latch mode.

18. A pump unit, comprises:
 a capacitor, having a first terminal for receiving a first signal and a second terminal;
 a first transistor, having a first terminal coupled to the second terminal of the capacitor, a second terminal for receiving a second signal, and a first gate terminal coupled to the first terminal of the capacitor;
 a second transistor, having a third terminal coupled to the first terminal of the capacitor, a fourth terminal for outputting an output signal, and a second gate terminal for receiving a third signal; and
 a third transistor, having a fifth terminal coupled to the third terminal of the second transistor, a sixth terminal coupled to the fourth terminal of the second transistor, and a third gate terminal coupled to the fifth terminal of the third transistor.

19. The pump unit according to claim 18, wherein the second signal is a first clock signal and the third signal is a second clock signal.

* * * * *